United States Patent
Takabe

(10) Patent No.: US 10,668,724 B2
(45) Date of Patent: Jun. 2, 2020

(54) PIEZOELECTRIC DEVICE, LIQUID EJECTING HEAD, AND LIQUID EJECTING APPARATUS

(71) Applicant: Seiko Epson Corporation, Tokyo (JP)

(72) Inventor: Motoki Takabe, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/262,075

(22) Filed: Jan. 30, 2019

(65) Prior Publication Data

US 2019/0232657 A1 Aug. 1, 2019

(30) Foreign Application Priority Data

Jan. 31, 2018 (JP) .................................. 2018-014564

(51) Int. Cl.
| | | |
|---|---|---|
| B41J 2/14 | (2006.01) | |
| H01L 41/08 | (2006.01) | |
| B41J 2/16 | (2006.01) | |

(52) U.S. Cl.
CPC ........... *B41J 2/14233* (2013.01); *B41J 2/161* (2013.01); *H01L 41/0815* (2013.01); *B41J 2002/14241* (2013.01); *B41J 2002/14491* (2013.01)

(58) Field of Classification Search
CPC .............. B41J 2/14233; B41J 2/161; B41J 2002/14241; B41J 2002/14491; H01L 41/0815
See application file for complete search history.

(56) References Cited

U.S. PATENT DOCUMENTS

| | | | |
|---|---|---|---|
| 5,530,465 A | * | 6/1996 | Hasegawa ............ B41J 2/14233 347/70 |
| 6,336,717 B1 | | 1/2002 | Shimada et al. |
| 2008/0024563 A1 | | 1/2008 | Matsui et al. |
| 2009/0284568 A1 | | 11/2009 | Yazaki |
| 2012/0056946 A1 | | 3/2012 | Kojima et al. |

(Continued)

FOREIGN PATENT DOCUMENTS

| | | |
|---|---|---|
| EP | 1116588 A1 | 7/2001 |
| EP | 1608031 A2 | 12/2005 |

(Continued)

OTHER PUBLICATIONS

Extended European Search Report for Patent Application No. EP 19154429.5 dated Jul. 8, 2019 (12 pages).

*Primary Examiner* — Geoffrey S Mruk
(74) *Attorney, Agent, or Firm* — Harness, Dickey & Pierce, P.L.C.

(57) ABSTRACT

A piezoelectric device includes an active portion of a piezoelectric layer interposed between a first electrode and a second electrode is provided independently for each of a first recessed portions, the first electrode forms an individual electrode provided independently for each of the active portions, the second electrode forms a common electrode commonly provided to a plurality of the active portions, in the piezoelectric layer, a second recessed portion which is provided outside the active portion and opens on a side opposite to a substrate is provided, and in a lamination direction of the substrate and the piezoelectric element, a vibration plate has a nitride film as an uppermost layer on the second electrode side at least in a region overlapping a bottom surface of the second recessed portion.

17 Claims, 12 Drawing Sheets

(56) References Cited

U.S. PATENT DOCUMENTS

| | | |
|---|---|---|
| 2013/0250009 A1 | 9/2013 | Ishimori et al. |
| 2014/0267508 A1 | 9/2014 | Ohashi et al. |
| 2016/0043299 A1 | 2/2016 | Fujimori et al. |
| 2016/0101621 A1 | 4/2016 | Naganuma et al. |
| 2016/0236470 A1 | 8/2016 | Mizukami |
| 2017/0087843 A1 | 3/2017 | Mikoshiba et al. |
| 2017/0179368 A1* | 6/2017 | Sumi .................... H01L 41/081 |

FOREIGN PATENT DOCUMENTS

| | | |
|---|---|---|
| JP | 2005-278265 A | 10/2005 |
| JP | 2008-066623 A | 3/2008 |
| JP | 2009-214522 A | 9/2009 |
| JP | 2010-228268 A | 10/2010 |
| JP | 2016-150471 A | 8/2016 |
| WO | WO-2017-0043050 A1 | 3/2017 |

* cited by examiner

PIEZOELECTRIC DEVICE, LIQUID EJECTING HEAD, AND LIQUID EJECTING APPARATUS

The entire disclosure of Japanese Patent Application No. 2018-014564, filed Jan. 31, 2018 is expressly incorporated by reference herein.

BACKGROUND

1. Technical Field

The present invention relates to a piezoelectric device, a liquid ejecting head including the piezoelectric device, and a liquid ejecting apparatus including the liquid ejecting head.

2. Related Art

In the related art, a liquid ejecting head that ejects a liquid droplet from a nozzle communicating with a pressure generating chamber by deforming a piezoelectric element to generate a pressure variation in a liquid in the pressure generating chamber is known. As a typical example thereof, there is an ink jet type recording head that ejects an ink droplet as a liquid droplet.

For example, the ink jet type recording head includes a piezoelectric element on one surface side of a flow path forming substrate provided with a pressure generating chamber communicating with a nozzle opening via a vibration plate, and deforms the vibration plate by driving the piezoelectric element to cause a pressure variation in the pressure generating chamber, thereby causing the ink droplet to be ejected from the nozzle.

Here, the piezoelectric element is formed of a first electrode, a piezoelectric layer, and a second electrode provided on the vibration plate including zirconium oxide as an uppermost layer (for example, refer to JP-A-2010-228268). In addition, in such a piezoelectric element, an active portion which is interposed between the first electrode and the second electrode and serves as a substantial driving portion is provided for each region facing the pressure generating chamber of the vibration plate. On both sides of the active portion in the region facing the pressure generating chamber, there is a region where the vibration plate or the vibration plate and an inactive portion of the piezoelectric element are laminated, which is called an arm portion. Furthermore, in such a piezoelectric element, by providing a recessed portion that opens on the side opposite to the substrate in the region corresponding to the arm portion of the piezoelectric layer, the displacement characteristic of the piezoelectric element can be improved, that is, displaced significantly at low voltage.

However, by providing the recessed portion in the piezoelectric layer, since the vibration plate is exposed or is close to an external atmosphere, there is a problem that the zirconium oxide of the vibration plate and moisture react with each other in the high humidity environment and the characteristics of the vibration plate change.

In addition, although a configuration in which an inside of the recessed portion, particularly a bottom surface of the recessed portion, is covered with the second electrode is also disclosed, moisture permeates through the second electrode, and moisture permeated through the second electrode reacts with the zirconium oxide of the vibration plate, so that there is a problem that the characteristics of the vibration plate change.

In particular, in the ink jet type recording head having a configuration in which the second electrode is commonly provided across a plurality of the active portions as in JP-A-2010-228268, with the increase in the density of the active portion, a film thickness of the second electrode is thin, and moisture easily permeates through the second electrode, so that characteristics of the vibration plate due to moisture are likely to change.

Such a problem is not limited to the liquid ejecting head typified by the ink jet type recording head, and exists in other piezoelectric devices as well.

SUMMARY

An advantage of some aspects of the invention is to provide a piezoelectric device, a liquid ejecting head, and a liquid ejecting apparatus in which a characteristic of a vibration plate is inhibited from changing due to moisture.

According to an aspect of the invention, there is provided a piezoelectric device including a substrate on which a plurality of first recessed portions are formed, a vibration plate provided on one surface side of the substrate, a first electrode provided on the one surface side of the substrate via the vibration plate, a piezoelectric layer provided on the first electrode, and a piezoelectric element that has a second electrode provided on the piezoelectric layer, in which in the piezoelectric element, an active portion of the piezoelectric layer interposed between the first electrode and the second electrode is provided independently for each of the first recessed portions, the first electrode forms an individual electrode provided independently for each of the active portions, the second electrode forms a common electrode commonly provided to a plurality of the active portions, in the piezoelectric layer, a second recessed portion which is provided outside the active portion and opens on a side opposite to the substrate is provided, and in a lamination direction of the substrate and the piezoelectric element, the vibration plate has a nitride film as an uppermost layer on the second electrode side at least in a region overlapping a bottom surface of the second recessed portion.

In this case, by providing the second recessed portion, the displacement characteristic of the piezoelectric element can be improved. Even if the vibration plate approaches the external atmosphere by the second recessed portion, by providing the nitride film as the uppermost layer of a region overlapping the bottom surface of the second recessed portion of the vibration plate, the reaction between moisture from the outside such as moisture contained in the atmosphere and the vibration plate can be inhibited, and the change in the characteristics of the vibration plate due to moisture can be inhibited.

Here, it is preferable that the vibration plate have a zirconium oxide film containing zirconium oxide at least in a region overlapping the active portion serving as a region not overlapping the bottom surface of the second recessed portion, of regions overlapping a region where the piezoelectric layer is formed in the lamination direction, and the zirconium oxide film be provided closer to the piezoelectric layer side than the nitride film. According to this, by providing the zirconium oxide film on the vibration plate, rigidity and toughness of the vibration plate can be improved. In addition, by providing the zirconium oxide film, it is possible to preferentially orient a crystal plane of the active portion of the piezoelectric layer on the (100) plane, and to improve the displacement characteristic of the active portion. In addition, by providing the zirconium oxide film, components contained in the piezoelectric layer can be inhibited from diffusing below the zirconium oxide film.

In addition, it is preferable that the second electrode be formed on an inner surface of the second recessed portion. According to this, it is possible to lower the electric resistance value of the second electrode and inhibit the voltage drop. In addition, by providing the second electrode in the second recessed portion, moisture can be hardly permeated from the second recessed portion to the vibration plate side by the second electrode.

In addition, it is preferable that the zirconium oxide film extend in a region overlapping between the active portion and the bottom surface of the second recessed portion, without being in contact with the second electrode formed on a side surface of the second recessed portion. According to this, by providing the zirconium oxide film with a larger area than the active portion, the rigidity and the toughness of the vibration plate can be further improved as compared with the case where the zirconium oxide film is provided only in the region overlapping the active portion. In addition, by extending the zirconium oxide film in a region overlapping between the active portion and the bottom surface of the second recessed portion, it is possible to inhibit the components contained in the piezoelectric layer from diffusing below the zirconium oxide film even in the extended region. Furthermore, by inhibiting the zirconium oxide film from coming into contact with the second electrode, moisture permeated through the second electrode hardly reaches the zirconium oxide film, and the zirconium oxide film can be inhibited from being hydrolyzed with moisture.

In addition, it is preferable that the zirconium oxide film be provided only in the region overlapping the active portion in the lamination direction. According to this, the zirconium oxide film is not exposed on the inner surface of the second recessed portion, and the zirconium oxide film reacts with moisture contained in the external atmosphere and is inhibited from being hydrolyzed.

In addition, it is preferable that the plurality of the active portions be disposed in parallel in a first direction, and the second recessed portions be provided on both sides of the active portion in the first direction. According to this, the active portion can be disposed in high density in the first direction X and the displacement amount of the active portion can be improved.

In addition, it is preferable that in the lamination direction, the second recessed portion and the first recessed portion be disposed on at least a position partially overlapping each other. According to this, the rigidity of the arm portion between the wall surface of the first recessed portion of the piezoelectric element and the active portion can be reduced to improve the displacement characteristic of the active portion.

In addition, it is preferable that the second recessed portion be provided so as to penetrate the piezoelectric layer in the lamination direction. According to this, by providing the second recessed portion penetrating the piezoelectric layer in the lamination direction, the rigidity of the arm portion is decreased and the displacement characteristic of the active portion is improved. Even if the second electrode is directly provided on the vibration plate, moisture permeated through the second electrode can be inhibited from reacting with the vibration plate by providing the nitride film as the uppermost layer of the vibration plate.

In addition, it is preferable that the vibration plate have an oxide film containing silicon oxide on the substrate side. According to this, by forming the oxide film on the substrate side of the vibration plate, when forming the first recessed portion by anisotropically etching the substrate, over-etching of the vibration plate can be inhibited, variations in the thickness of the vibration plate can be inhibited, and variations in the displacement characteristics of the active portion can be inhibited.

In addition, it is preferable that the oxide film have an opening portion communicating with the first recessed portion. According to this, the displacement of the active portion can be inhibited from being constrained by the oxide film, and the displacement characteristic of the active portion can be improved.

Furthermore, according to another aspect of the invention, there is provided a liquid ejecting head including the piezoelectric device described above.

In this case, it is possible to realize the liquid ejecting head in which the vibration plate is inhibited from breaking due to moisture to improve reliability.

In addition, according to still another aspect of the invention, there is provided a liquid ejecting apparatus including the liquid ejecting head described above.

It is possible to realize the liquid ejecting apparatus in which the vibration plate is inhibited from breaking due to moisture to improve reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the invention will be described in detail based on embodiments.

Embodiment 1

Figure 1:
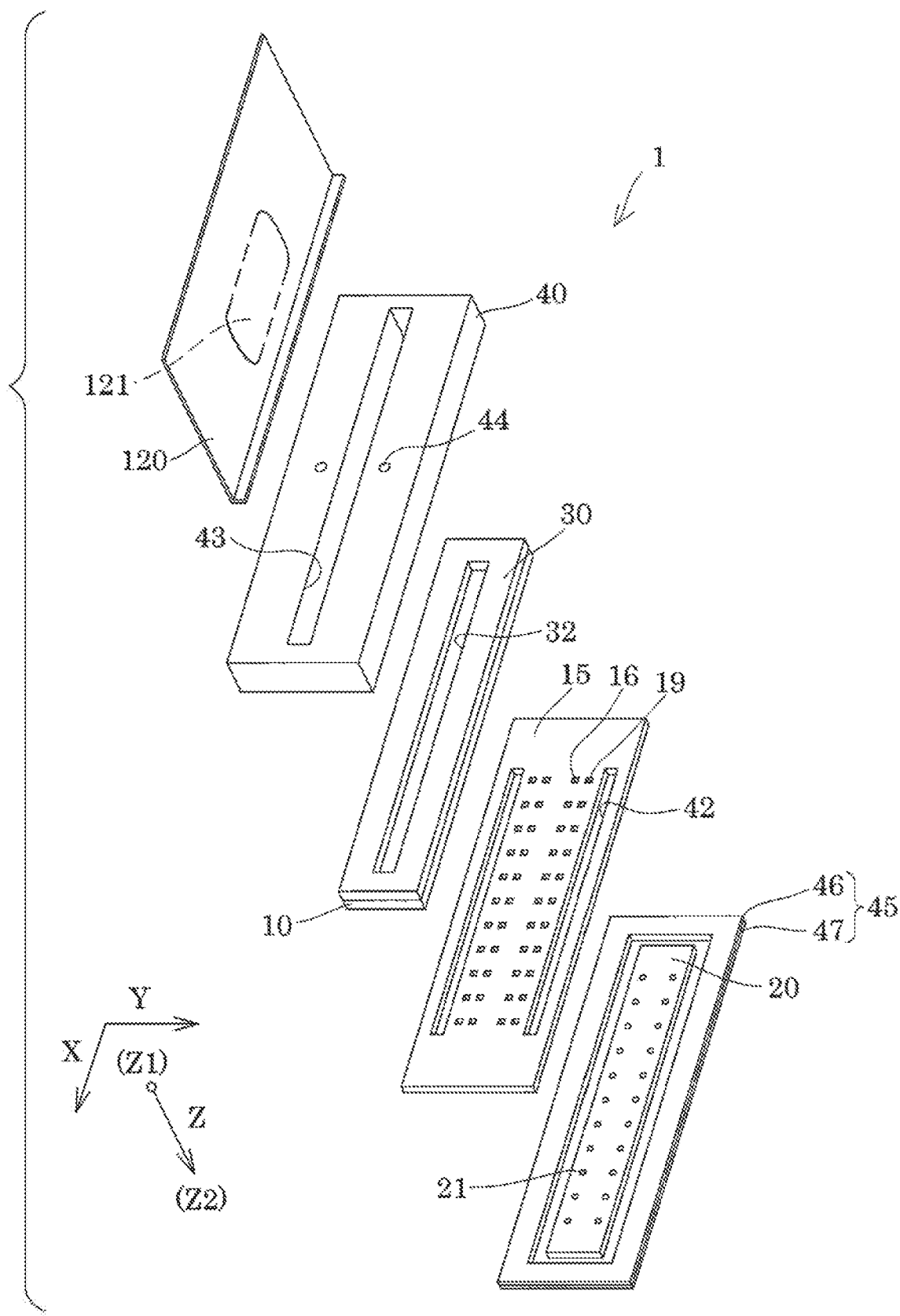
FIG. 1 is an exploded perspective view of a recording head according to Embodiment 1 of the invention.
Figure 2:
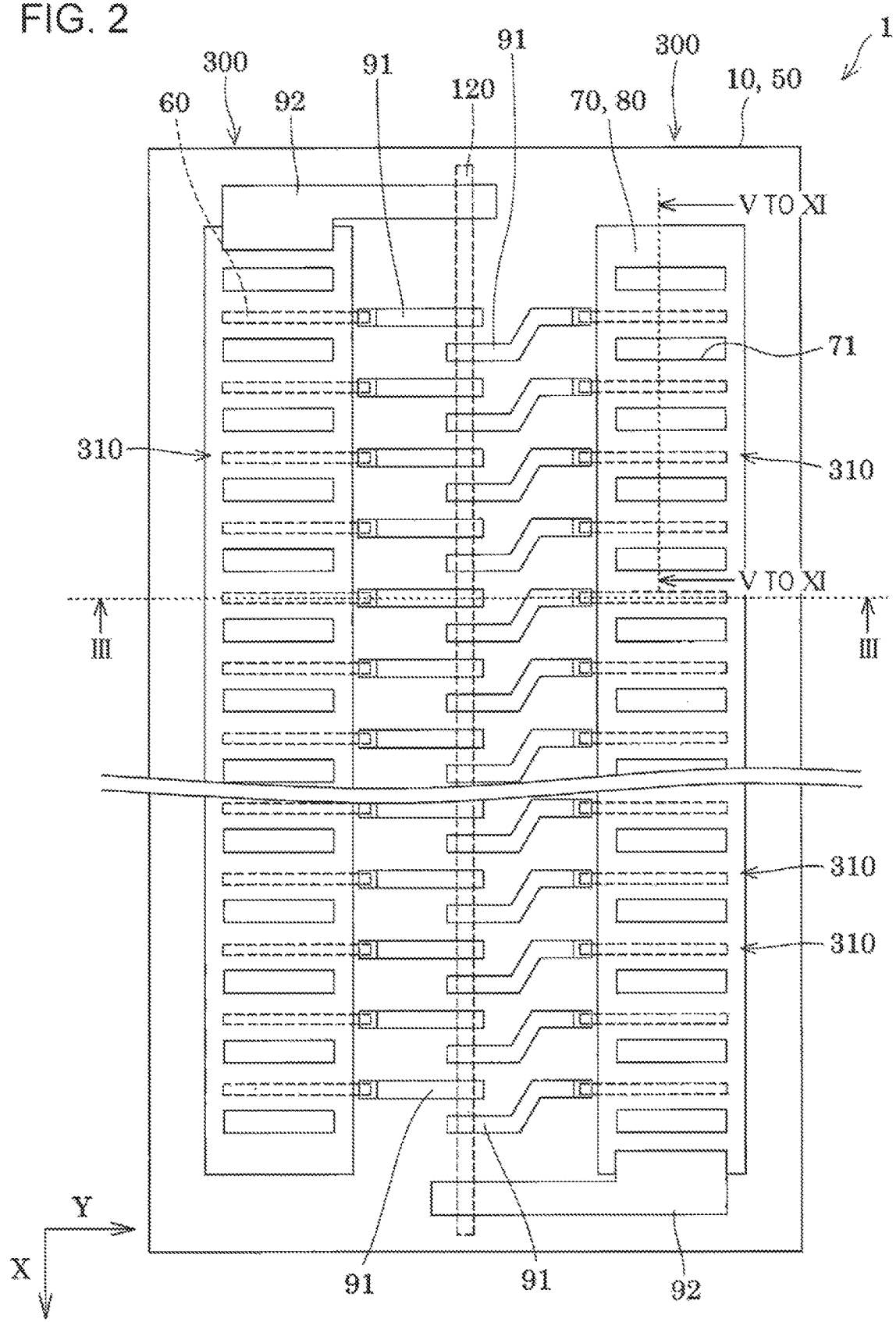
FIG. 2 is a plan view of a flow path forming substrate according to Embodiment 1 of the invention.
Figure 3:
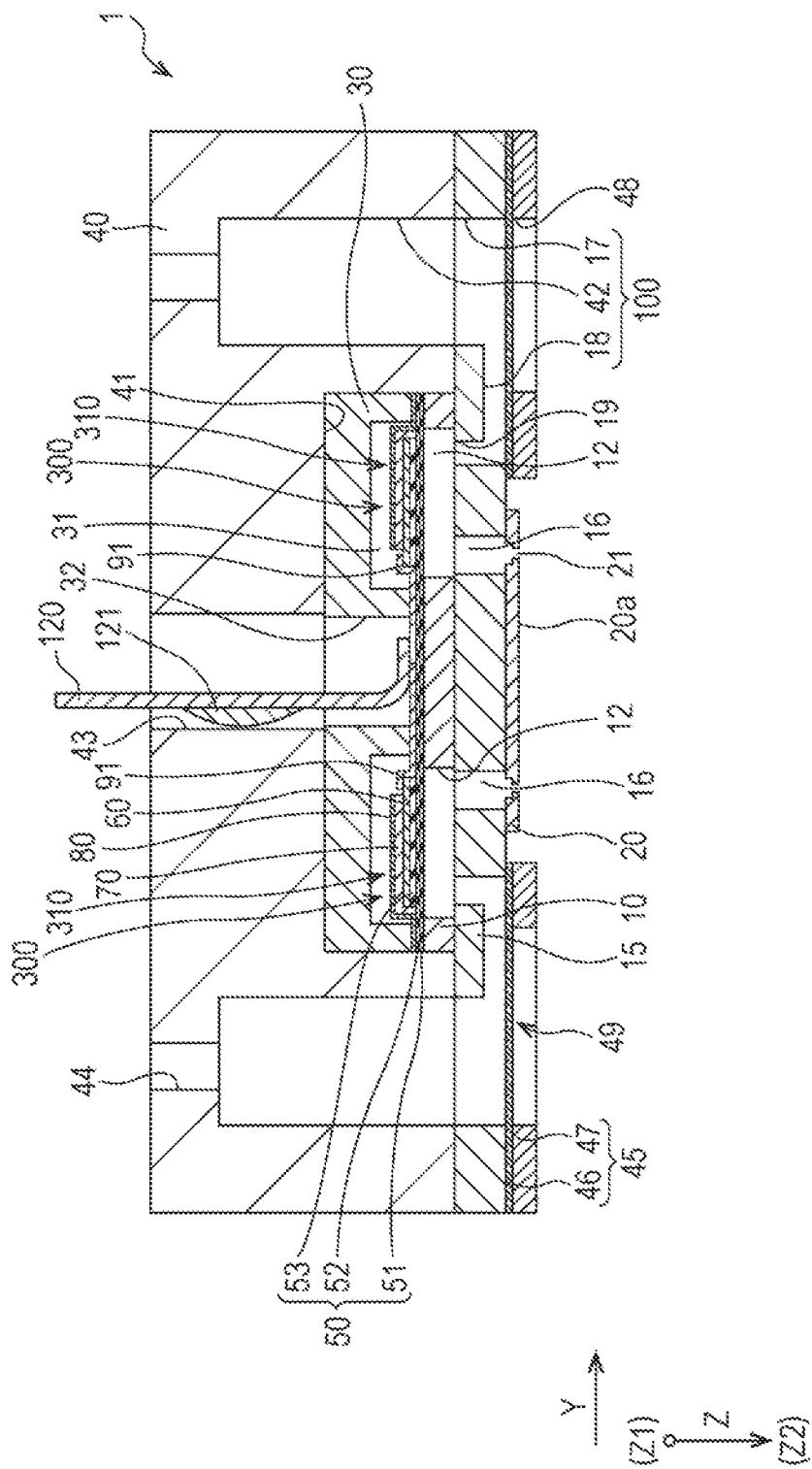
FIG. 3 is a cross-sectional view of the recording head according to Embodiment 1 of the invention.
Figure 4:
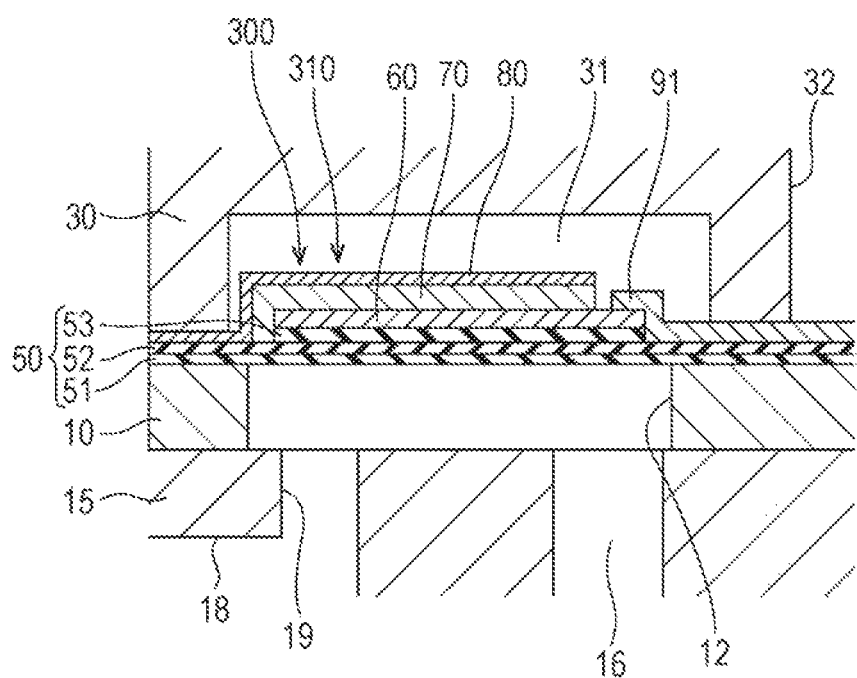
FIG. 4 is an enlarged cross-sectional view of a main part of the recording head according to Embodiment 1 of the invention.
Figure 5:
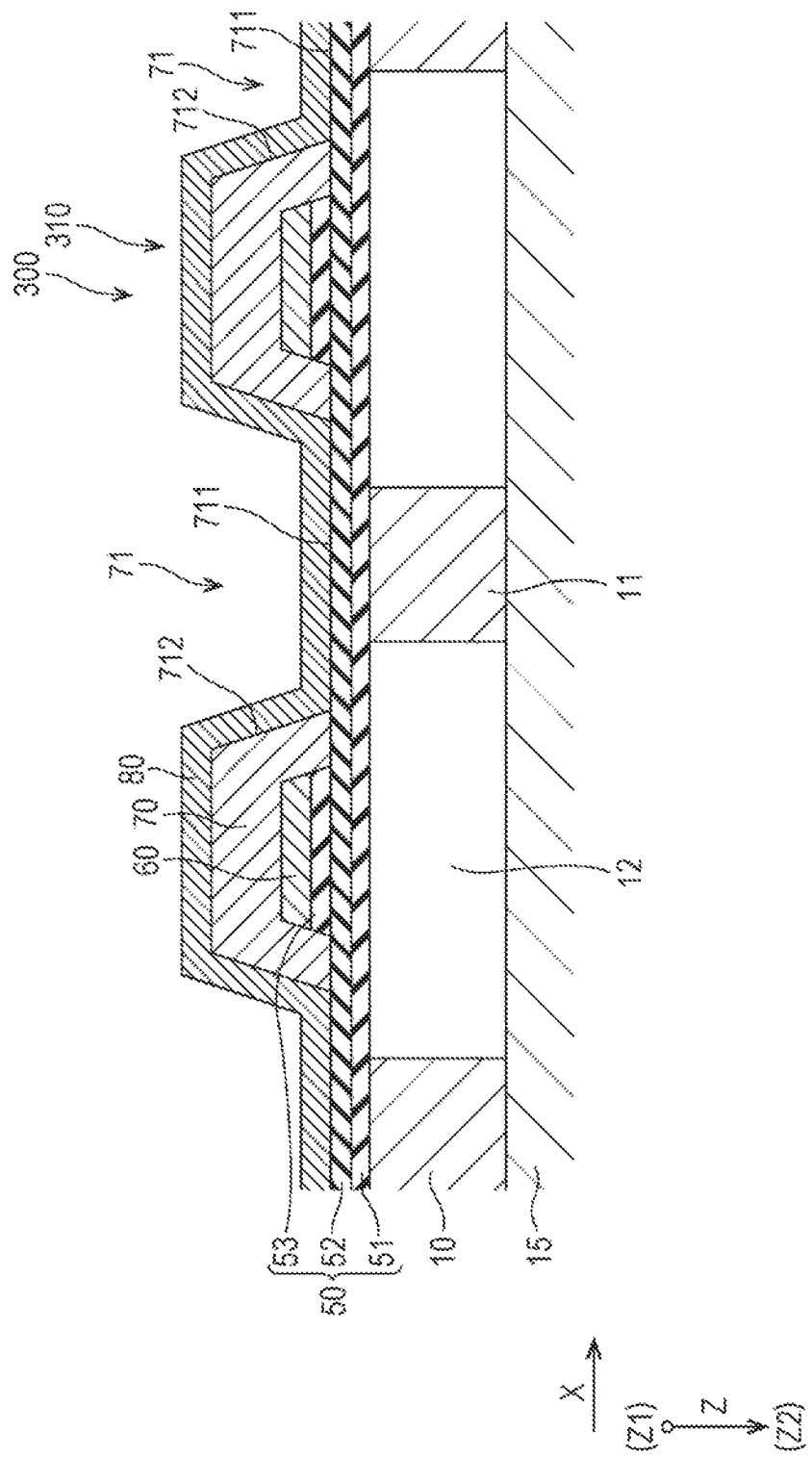
FIG. 5 is an enlarged cross-sectional view of a main part of the recording head according to Embodiment 1 of the invention.

FIG. 1 is an exploded perspective view of an ink jet type recording head as a liquid ejecting head according to Embodiment 1 of the invention. FIG. 2 is a plan view of a flow path forming substrate of a recording head. FIG. 3 is a cross-sectional view taken along line III-III in FIG. 2. FIG. 4 is an enlarged view of a main part of FIG. 3. FIG. 5 is a cross-sectional view taken along line V-V in FIG. 2.

As shown in the figure, as the flow path forming substrate 10 serving as the substrate forming the ink jet recording head 1 (hereinafter also simply referred to as recording head 1) of the embodiment, a metal such as stainless steel or Ni, a ceramic material typified by $ZrO_2$ or $Al_2O_3$, a glass ceramic material, an oxide such as MgO, $LaAlO_3$ can be used. In the embodiment, the flow path forming substrate 10 is made of a silicon single crystal substrate. On the flow path forming substrate 10, by performing anisotropic etching from one surface side, the pressure generating chambers 12 serving as first recessed portions partitioned by a plurality of partition walls 11 are disposed in parallel along the direction where the plurality of nozzles 21 discharging ink are disposed in parallel. Hereinafter, this direction is referred to as a parallel arrangement direction of the pressure generating chambers 12 or a first direction X. In addition, in the flow path forming substrate 10, a plurality of rows in which the pressure generating chambers 12 are disposed in parallel in the first direction X are provided, and two rows are provided in this embodiment. The arrangement direction in which a plurality of rows of the pressure generating chambers 12 are provided is hereinafter referred to as a second direction Y. An arrangement direction where the plurality of the rows of the pressure generating chambers are provided is hereinafter referred to as a second direction Y. In the embodiment, a portion between the pressure generating chambers 12 disposed in parallel in the first direction X of the flow path forming substrate 10 is referred to as a partition wall 11. The partition wall 11 is formed along the second direction Y. That is, the partition wall 11 is referred to as a portion that overlaps the pressure generating chamber 12 in the second direction Y of the flow path forming substrate 10. Furthermore, a direction orthogonal to both the first direction X and the second direction Y is referred to as a third direction Z. A side of a case member 40 to be described in detail later is referred to as a Z1 side, and a side of a nozzle plate 20 as a Z2 side. Although the first direction X, the second direction Y, and the third direction Z are orthogonal to each other, the directions are not particularly limited thereto, and may be directions intersecting at an angle other than orthogonal to each other.

A communicating plate 15 and the nozzle plate 20 are sequentially laminated on the Z2 side serving as one surface side of such a flow path forming substrate 10.

As shown in FIG. 3, the communicating plate 15 is provided with a nozzle communicating path 16 communicating the pressure generating chamber 12 and the nozzle 21. The communicating plate 15 has an area larger than that of the flow path forming substrate 10 and the nozzle plate 20 has an area smaller than that of the flow path forming substrate 10. Since the nozzle 21 of the nozzle plate 20 and the pressure generating chamber 12 are separated from each other by providing the communicating plate 15 as described above, the ink in the pressure generating chamber 12 is unlikely to be affected by thickening due to evaporation of moisture in the ink caused by ink near the nozzle 21. In addition, since the nozzle plate 20 need only cover an opening of the nozzle communicating path 16 communicating the pressure generating chamber 12 and the nozzle 21, the area of the nozzle plate 20 can be made comparatively small and the cost can be reduced. In the embodiment, a surface of the nozzle plate 20 where the nozzle 21 is opened and the ink droplet is discharged is referred to as a liquid ejecting surface 20a.

In addition, the communicating plate 15 is provided with a first manifold portion 17 and a second manifold portion 18 which form a portion of a manifold 100.

The first manifold portion 17 is provided so as to penetrate the communicating plate 15 in the third direction Z.

The second manifold portion 18 is provided so as to open on the nozzle plate 20 side of the communicating plate 15 without penetrating the communicating plate 15 in the third direction Z.

In addition, a supply communicating path 19 communicating with one end portion of the pressure generating chamber 12 in the second direction Y is provided in the communicating plate 15 independently for each of the pressure generating chambers 12. The supply communicating path 19 communicates the second manifold portion 18 and the pressure generating chamber 12 and supplies the ink in the manifold 100 to the pressure generating chamber 12.

As such a communicating plate 15, a metal such as stainless steel or nickel (Ni), ceramics such as zirconium (Zr) can be used. The communicating plate 15 is preferably made of a material having the same coefficient of linear expansion as that of the flow path forming substrate 10. That is, in a case where the communicating plate 15 is made of a material having a significantly different coefficient of linear expansion from the flow path forming substrate 10, by being heated or cooled, warpage occurs due to a difference in coefficient of linear expansion between the flow path forming substrate 10 and the communicating plate 15. In the embodiment, by using the same material as the flow path forming substrate 10 as the communicating plate 15, that is, a silicon single crystal substrate, it is possible to inhibit the occurrence of warpage due to heat, or cracks, separation, or the like due to heat.

The nozzle 21 communicating with each pressure generating chamber 12 via the nozzle communicating path 16 is formed in the nozzle plate 20. That is, in the nozzles 21, nozzles for ejecting the same type of liquid (ink) are disposed in parallel in the first direction X, and two rows of the nozzles 21 disposed in parallel in the first direction X are formed in the second direction Y.

As such a nozzle plate 20, for example, a metal such as stainless steel (SUS), an organic material such as a polyimide resin, a silicon single crystal substrate can be used. By using the silicon single crystal substrate as the nozzle plate 20, the coefficient of linear expansion between the nozzle plate 20 and the communicating plate 15 is made equal, and it is possible to inhibit the occurrence of cracks, separation, or the like due to warpage or heat by being heated or cooled.

On the other hand, a vibration plate 50 is formed on the Z1 side serving as the other side of the flow path forming substrate 10. Although described in detail later, the vibration plate 50 has an oxide film 51 containing silicon oxide ($SiO_X$) provided on the flow path forming substrate 10 side, a nitride film 52 formed on the oxide film 51, and a zirconium oxide film 53 containing zirconium oxide ($ZrO_X$) formed on a portion of the nitride film 52. In the embodiment, the oxide film 51 containing silicon dioxide ($SiO_2$) and the zirconium oxide film 53 containing the zirconium oxide ($ZrO_2$) are used. Here, the oxide film 51 may contain other materials as long as the oxide film 51 contains the silicon oxide as a main component. Incidentally, the fact that the main component of the oxide film 51 is the silicon oxide means that the silicon oxide contained in the oxide film 51 is 50% or more by mass. In addition, the zirconium oxide film 53 may contain other materials as long as the zirconium oxide film 53 contains the zirconium oxide as a main component. The fact that the main component of the zirconium oxide film 53 is the zirconium oxide means that the zirconium oxide contained in the zirconium oxide film 53 is 50% or more by mass. In addition, the material of the oxide film 51 is not limited to the silicon oxide, and titanium oxide or the like may be used. In addition, since the side of a second electrode 80 of the oxide film 51 is protected by the nitride film 52, the zirconium oxide may be used as the material of the oxide film 51.

The liquid flow path such as the pressure generating chamber 12 is formed by performing anisotropic etching on the flow path forming substrate 10 from one surface side (surface side to which nozzle plate 20 is bonded), and the other surface of the pressure generating chamber 12 is defined by the oxide film 51. That is, the oxide film 51 functions as an etching stop layer in anisotropic etching of the flow path forming substrate 10. That is, by providing the oxide film 51 containing the silicon oxide, when anisotropically etching the flow path forming substrate 10, overetching of the vibration plate 50 can be inhibited and variations in the thickness of the vibration plate 50 can be inhibited. It goes without saying that the oxide film 51 made of a material other than the silicon oxide may be provided on one surface side of the flow path forming substrate 10. In a case where the oxide film 51 of a material other than the silicon oxide is used and the oxide film 51 does not function as the etching stop layer of anisotropic etching, the pressure generating chamber 12 may be formed by dry etching the flow path forming substrate 10.

In addition, as shown in FIGS. 4 and 5, on the vibration plate 50 of the flow path forming substrate 10, a piezoelectric actuator 300 including a first electrode 60, the piezoelectric layer 70, and a second electrode 80 is formed. In the embodiment, the piezoelectric actuator 300 serves as a pressure generating means for causing pressure change in the ink in the pressure generating chamber 12. Here, the piezoelectric actuator 300 is also referred to as a piezoelectric element 300, and is a portion including the first electrode 60, the piezoelectric layer 70, and the second electrode 80. In addition, a portion where piezoelectric strain occurs in the piezoelectric layer 70 when a voltage is applied between the first electrode 60 and the second electrode 80 is referred to as an active portion 310. That is, the active portion 310 is referred to as a portion where the piezoelectric layer 70 is interposed between the first electrode 60 and the second electrode 80 in the third direction Z. In the embodiment, the active portion 310 is formed for each pressure generating chamber 12 serving as the first recessed portion. In the embodiment, the first electrode 60 forms an individual electrode independently provided for each of the active portions 310, and the second electrode 80 forms a common electrode which is commonly provided for the plurality of the active portions 310.

Here, the first electrode 60 forming the piezoelectric actuator 300 of the embodiment is separated for each pressure generating chamber 12 and forms an independent individual electrode for each active portion 310 serving as a substantial driving portion of the piezoelectric actuator 300. The first electrode 60 is formed with a width narrower than the width of the pressure generating chamber 12 in the first direction X serving as the parallel arrangement direction of the active portions 310. That is, in the first direction X of the pressure generating chamber 12, the end portion of the first electrode 60 is located inside the region facing the pressure generating chamber 12. As will be described in detail later, since the second electrode 80 is wider than the first electrode 60 in the first direction X, the width of the active portion 310 in the first direction X according to the embodiment is defined by the first electrode 60.

The material of the first electrode 60 is required to be a material that does not oxidize and can maintain conductivity when the piezoelectric layer 70 described later is formed, and for example, a noble metal such as platinum lanthanum nickel oxide (LNO) or the like is preferably used.

In addition, as the first electrode 60, an adhesion layer for ensuring adhesion strength between the above-described conductive material and the vibration plate 50 may be used. In the embodiment, although not shown, titanium is used as the adhesion layer. As the adhesion layer, zirconium, titanium, titanium oxide, or the like can be used. That is, in the embodiment, the first electrode 60 is formed of an adhesion layer made of titanium and at least one conductive layer selected from the above-described conductive materials.

As shown in FIG. 4, the piezoelectric layer 70 is provided continuously in the first direction X so that the second direction Y has a predetermined width.

In the second direction Y of the pressure generating chamber 12, the end portion of the piezoelectric layer 70 on the supply communicating path 19 side is located outside the end portion of the first electrode 60. That is, the end portion of the first electrode 60 is covered with the piezoelectric layer 70. In addition, in the second direction Y, the end portion of the piezoelectric layer 70 on the nozzle side is located inside the end portion of the first electrode 60 (pressure generating chamber 12 side), and the end portion of the first electrode 60 on the nozzle 21 side is not covered with the piezoelectric layer 70.

The piezoelectric layer 70 is made of an oxide piezoelectric material having a polarization structure formed on the first electrode 60, for example, can be made of a perovskite type oxide represented by the general formula $ABO_3$, and a lead-based piezoelectric material containing lead or a lead-free piezoelectric material containing no lead can be used. The piezoelectric layer 70 can be formed by, for example, a liquid phase method such as a sol-gel method, a metal-organic decomposition (MOD) method, and a physical vapor deposition (PVD) method (gas phase method) such as a sputtering method, a laser ablation method.

In such a piezoelectric layer 70, as shown in FIG. 5, a second recessed portion 71 is formed outside the active portion 310 and opens on the side opposite to the flow path forming substrate 10. That is, since the active portion 310 of the embodiment is defined by the first electrode 60 in the first direction X, the second recessed portion 71 is provided outside the first electrode 60 in the first direction X. In addition, since the active portions 310 are disposed in parallel in the first direction X, the second recessed portion 71 is disposed between the active portions 310 adjacent to each other in the first direction X.

In addition, in the embodiment, the second recessed portion 71 is provided so as to penetrate the piezoelectric layer 70 in the third direction Z serving as a lamination direction. That is, the second recessed portion 71 is formed to have a depth reaching the vibration plate 50, the piezoelectric layer 70 is not formed on a bottom surface 711 of the second recessed portion 71, and the vibration plate 50 is exposed on the bottom surface 711 of the second recessed portion 71.

Here, the second recessed portion 71 and the pressure generating chamber 12 serving as the first recessed portion are disposed on at least a position where a portion thereof overlaps each other in the third direction Z serving as the lamination direction of the flow path forming substrate 10 and the piezoelectric element 300. In addition, the width of the second recessed portion 71 in the first direction X is preferably substantially equal to or larger than the width of each partition wall 11 in the first direction X. Here, the width of the second recessed portion 71 in the first direction X is the width closest to the pressure generating chamber 12 side serving as the first recessed portion in the third direction Z, that is, the width of the bottom surface side of the second recessed portion 71. In addition, in the first direction X, the width of the pressure generating chamber 12 serving as the first recessed portion is referred to as a width closest to the second recessed portion 71 side in the third direction Z, that is, the width on the bottom surface side.

Incidentally, the fact that the pressure generating chamber 12 serving as the first recessed portion and the second recessed portion 71 are disposed on at least a position partially overlapping each other in the third direction Z include those in which the bottom surface 711 sides defining the width of the pressure generating chamber 12 and the second recessed portion 71 do not overlap each other. That is, for example, if a side surface of the pressure generating chamber 12 and a side surface 712 of the second recessed portion 71 are inclined, even if the bottom surfaces do not overlap each other, it is also possible to dispose so that the opening sides partially overlap each other.

By providing the second recessed portion 71 in the piezoelectric layer 70 in this manner, the rigidity of an arm portion between the wall surface of the vibration plate 50 and the pressure generating chamber 12 of the piezoelectric element 300 and the active portion 310 can be reduced, and the piezoelectric element 300 can be satisfactorily displaced.

The width of the second recessed portion 71 in the first direction X is substantially the same as or wider than the width of each partition wall 11 in the first direction X, that is, the bottom surface side defining the width in the first direction X of the pressure generating chamber 12 and the second recessed portion 71 is disposed on at least a position partially overlapping each other in the third direction Z. Accordingly, the thickness of the film forming the arm portion in the third direction Z can be reduced, and the displacement characteristic of the piezoelectric element 300 can be improved, that is, a high displacement can be obtained with a low voltage.

In addition, in the embodiment, the second recessed portion 71 is provided so as to penetrate the piezoelectric layer 70 in the third direction Z, the bottom surface 711 of the second recessed portion 71 is formed by the surface of the vibration plate 50.

The second electrode 80 is provided on the side of the piezoelectric layer 70 opposite to the first electrode 60 and forms a common electrode common to the plurality of the active portions 310. In addition, the second electrode 80 is provided continuously over the inner surface of the second recessed portion 71, that is, the bottom surface 711 of the second recessed portion 71 on the flow path forming substrate 10 side and the side surface 712 on the piezoelectric layer 70 side. The second electrode 80 may not be provided on the inner surface of the second recessed portion 71.

Such a second electrode 80 is desirably a material that can form an interface of the piezoelectric layer 70 satisfactorily, and can exhibit conductivity and piezoelectric characteristics. A noble metal material such as iridium (Ir), platinum (Pt), palladium (Pd), gold (Au), or a conductive oxide typified by lanthanum nickel oxide (LNO) is preferably used. In addition, the second electrode 80 may be a lamination of a plurality of materials. In the embodiment, a laminated electrode of iridium and titanium (iridium is in contact with piezoelectric layer 70) is used. The second electrode 80 can be formed by, for example, a physical vapor deposition (PVD) method (gas phase method) such as a sputtering method, a laser ablation method, and a liquid phase method such as a sol-gel method, a metal-organic decomposition (MOD) method, plating method. In addition, by performing heat treatment after forming the second electrode 80, characteristics of the piezoelectric layer 70 can be improved.

Here, as described above, the vibration plate 50 is provided with the oxide film 51, the nitride film 52, and the zirconium oxide film 53.

The oxide film 51 is provided over the entire surface of the flow path forming substrate 10 on the Z1 side.

The nitride film 52 is provided as the uppermost layer on the side of the second electrode 80 at least in a region overlapping the bottom surface 711 of the second recessed portion 71, in the third direction Z serving as the lamination direction of the flow path forming substrate 10 and the piezoelectric element 300. That is, the nitride film 52 is formed in the third direction Z at least in the region overlapping the bottom surface 711 of the second recessed portion 71 in the third direction Z, and the nitride film 52 provided at least in the region overlapping the bottom surface 711 of the second recessed portion 71 is the uppermost layer on the side of the second electrode 80 of the vibration plate 50. That is, at least in the region overlapping the bottom surface 711 of the second recessed portion 71 of the nitride film 52, the other layer of the vibration plate 50, for example, the zirconium oxide film 53 may not be formed on the second electrode 80 side serving as an upper layer from the nitride film 52. In the embodiment, the nitride film 52 is provided over the entire surface of the oxide film 51 on the Z1 side as the piezoelectric element 300 side.

By providing the nitride film 52 in this manner, the bottom surface 711 of the second recessed portion 71 is formed by the surface of the nitride film 52.

As the material of the nitride film 52, for example, at least one selected from nitrides using metals of Groups 4 to 6 and nitrides using metals of Group 10 to 13, semi-metals can be used. That is, as the nitride film 52, at least one selected from titanium nitride (TiN), zirconium nitride (ZrN), niobium nitride (NbN) Tantalum nitride (TaN), chromium nitride (CrN), tungsten nitride (WN), aluminum nitride (AlN), gallium nitride (GaN), carbon nitride (CN), silicon nitride (SiN), and indium nitride (InN) can be used. In addition, as the nitride film 52, a nitride obtained by combining the above-described materials, for example, TaAlN, AlGaN, TiCN, or the like can be used. In particular, it is preferable to use silicon nitride (SiN) as the nitride film 52. By using the nitride film 52 made of silicon nitride, it is easy to form a dense and highly adhesive film.

The zirconium oxide film 53 is provided on the surface of the piezoelectric layer 70 side from the nitride film 52, that is, on the surface of the Z1 side which is on the nitride film 52 in the embodiment. In addition, the zirconium oxide film 53 is provided at least in the region overlapping the active portion 310, serving as the region not overlapping the bottom surface 711 of the second recessed portion 71, of the regions overlapping the region where the piezoelectric layer 70 is formed in the third direction Z serving as the lamination direction. In the embodiment, the zirconium oxide film 53 is provided only in the region overlapping the active portion 310 in the third direction Z serving as the lamination direction. That is, the zirconium oxide film 53 is provided only between the first electrode 60 and the nitride film 52. Therefore, the zirconium oxide film 53 and the second electrode 80 provided on the side surface 712 of the second recessed portion 71 of the piezoelectric layer 70 are provided without being in contact with each other. That is, an inactive portion of the piezoelectric layer 70 exists between the zirconium oxide film 53 and the second electrode 80 provided on the side surface 712.

As described above, even if the bottom surface 711 of the vibration plate 50 is disposed at a position close to the outside atmosphere by the second recessed portion 71, the nitride film 52 is provided as the uppermost layer of the vibration plate 50 at least in the region overlapping the bottom surface 711 of the second recessed portion 71 in the third direction Z. Accordingly, it is possible to inhibit moisture permeated through the second electrode 80 from reacting with the vibration plate 50 in a high humidity environment or the like and to inhibit breakage or separation of the vibration plate 50 due to moisture. That is, since the nitride film 52 does not hydrolyze by reaction with moisture, even if moisture permeated through the second electrode 80 in the region corresponding to the second recessed portion 71 reaches the nitride film 52, the nitride film 52 does not react with moisture and the characteristic of the vibration plate 50 hardly changes. Incidentally, if the zirconium oxide film is provided as the uppermost layer of the vibration plate 50 in the region overlapping the bottom surface 711 of the second recessed portion 71, the vibration plate 50 breaks under the high humidity environment or the like. This is because the moisture permeated through the second electrode reacts with the zirconium oxide to change the characteristics of the zirconium oxide, that is, to be hydrolyzed and the vibration plate 50 and the second electrode 80 are separated from each other, so that the arm portion fixing the active portion 310 is configured to include only the vibration plate 50 and the tensile stress due to the displacement of the active portion 310 is applied to the vibration plate 50. In addition, the zirconium oxide reacts with moisture to hydrolyze, which is a factor that the toughness of the zirconium oxide is lowered. Therefore, in the embodiment, by providing the nitride film 52, it is possible to inhibit the reaction with moisture, which causes breakage of the vibration plate 50, and it is possible to inhibit the breakage of the vibration plate 50 under the high humidity environment or the like. In the embodiment, by providing the nitride film 52 as the uppermost layer of the region overlapping the bottom surface of the second recessed portion 71 of the vibration plate 50, moisture permeated through the second electrode 80 hardly permeates into the lower layer from the nitride film 52. Therefore, even when the zirconium oxide is used as the material of the oxide film 51 which is the lower layer of the nitride film 52, it is possible to inhibit the reaction of the oxide film 51 with moisture.

In addition, in the embodiment, since the oxide film 51 contains the silicon oxide, the adhesion between the oxide film 51 containing the silicon oxide and the nitride film 52 is higher than the adhesion between the oxide film 51 containing the silicon oxide and the zirconium oxide film 53.

Therefore, as compared with a case where the zirconium oxide film 53 is directly laminated on the oxide film 51, by laminating the nitride film 52 on the oxide film 51, it is possible to improve the adhesion between the oxide film 51 and the nitride film 52 as a film thereon to inhibit delamination of the vibration plate 50 having the laminated structure.

In addition, on the bottom surface 711 of the second recessed portion 71, the second electrode 80 is formed on the nitride film 52 of the vibration plate 50. The adhesion between the nitride film 52 and the second electrode 80 is higher than the adhesion between the zirconium oxide film 53 and the second electrode 80. Therefore, as compared with a case where the bottom surface 711 of the second recessed portion 71 is formed of the zirconium oxide film 53 and the second electrode 80 is formed on the zirconium oxide film 53, by forming the second electrode 80 on the nitride film 52, the adhesion between the vibration plate 50 and the second electrode 80 can be improved and separation of the vibration plate 50 from the second electrode 80, or breakage of the vibration plate 50 can be inhibited due to the fact that the arm portion formed of only the vibration plate 50 due to separation of the vibration plate 50 from the second electrode 80.

In addition, in the embodiment, by providing the zirconium oxide film 53 in the region overlapping the active portion 310 in the third direction Z, the rigidity and toughness of the vibration plate 50 can be ensured. In addition, by providing the zirconium oxide film 53 only in the region overlapping the active portion 310, it is possible to inhibit the moisture permeated through the second electrode 80 from reaching the zirconium oxide film 53 without bringing the zirconium oxide film 53 close to the external atmosphere. Therefore, it is possible to inhibit the reaction of the zirconium oxide film 53 with moisture, and to inhibit the change in the characteristics of the zirconium oxide film 53 due to moisture.

In addition, by providing the zirconium oxide film under the first electrode 60, it is possible to preferentially orient the crystal plane of the piezoelectric layer 70 on the (100) plane by epitaxial growth on the first electrode 60. By preferentially orienting the crystal plane of the active portion 310 of the piezoelectric layer 70 on the (100) plane in this manner, the displacement characteristic of the active portion 310 can be improved. The piezoelectric layer 70 is not limited to a layer preferentially oriented in the (100) plane, and may be a layer preferentially oriented in the (110) plane or the (111) plane depending on the orientation control layer provided as required.

In addition, by providing the zirconium oxide film 53 under the first electrode 60, it is possible to inhibit diffusion of components such as lead (Pb) and bismuth (Bi) contained in the piezoelectric layer 70 below the zirconium oxide film 53, that is, to the oxide film 51 or the flow path forming substrate 10 side. That is, by providing the zirconium oxide film 53, diffusion of components contained in the piezoelectric layer 70 to the oxide film 51 or the flow path forming substrate 10 is inhibited. Accordingly, it is possible to inhibit problems such as reduction in rigidity due to diffusion of components of the piezoelectric layer 70 to the oxide film 51, the flow path forming substrate 10, or the like.

In the embodiment, the flow path forming substrate 10, which is the substrate on which the pressure generating chambers 12 as the first recessed portion is formed, the vibration plate 50, the first electrode 60, the piezoelectric layer 70, the second electrode 80, and the piezoelectric element 300 having the second recessed portion 71 formed therein are collectively referred to as a piezoelectric device.

In addition, as shown in FIG. 2, from the first electrode 60 of the piezoelectric actuator 300, the individual wiring 91 as a lead wiring is led out. In addition, from the second electrode 80, a common wiring 92 which is the lead wiring is led out. Furthermore, a flexible cable 120 is connected to the end portions of the individual wiring 91 and the common wiring 92, which are extended on the side opposite to the end portion connected to the piezoelectric actuator 300. The flexible cable 120 is a wiring substrate having flexibility, and in the embodiment, a driving circuit 121 serving as a driving element is mounted.

A protective substrate 30 having substantially the same size as the flow path forming substrate 10 is bonded to the surface of such a flow path forming substrate 10 on the Z1 side. The protective substrate 30 has a holding portion serving as a space for protecting the piezoelectric actuator 300. Two holding portions 31 are formed in parallel in the second direction Y between rows of piezoelectric actuators 300 disposed in parallel in the first direction X. In addition, the protective substrate 30 is provided with a through-hole 32 penetrating in the third direction Z between the two holding portions 31 disposed in parallel in the second direction Y. End portions of the individual wiring 91 and the common wiring 92 led out from the electrode of the piezoelectric actuator 300 are extended so as to be exposed in the through-hole 32, and the individual wiring 91 and the common wiring 92 are electrically connected to the flexible cable 120 in the through-hole 32. A method of connecting the individual wiring 91 and the common wiring 92 to the flexible cable 120 is not particularly limited, and examples thereof include brazing such as soldering, eutectic bonding, welding, a conductive adhesive (ACP, ACF) containing conductive particles, a nonconductive adhesive (NCP, NCF) and the like.

In addition, as shown in FIG. 3, the case member 40 that defines the manifold 100 communicating with the plurality of the pressure generating chambers 12 and the flow path forming substrate 10 is fixed to the protective substrate 30. The case member 40 has substantially the same shape as the above-described communicating plate 15 in plan view, and is bonded to the protective substrate 30 and to the above-described communicating plate 15.

Such a case member 40 has a recessed portion 41 of a depth at which the flow path forming substrate 10 and the protective substrate 30 are accommodated on the protective substrate 30 side. The recessed portion 41 has an opening area larger than the surface of the protective substrate 30 bonded to the flow path forming substrate 10. The opening surface of the recessed portion 41 on the nozzle plate 20 side is sealed by the communicating plate 15 in a state where the flow path forming substrate 10 and the like are accommodated in the recessed portion 41. As a result, a third manifold portion 42 is defined by the case member 40 and the flow path forming substrate 10 on the outer peripheral portion of the flow path forming substrate 10. The manifold 100 of the embodiment is configured to include the first manifold portion and the second manifold portion 18 provided in the communicating plate 15, and the third manifold portion 42 defined by the case member 40 and the flow path forming substrate 10. The manifold 100 is continuously provided in the first direction X serving as the parallel arrangement direction of the pressure generating chambers 12, and the supply communicating paths 19 communicating each of the pressure generating chambers 12 and the manifold 100 are disposed in parallel in the first direction X.

In addition, a compliance substrate 45 is provided on the Z2 side surface of the communicating plate 15 on which the first manifold portion 17 and the second manifold portion 18 are opened. The compliance substrate 45 seals the openings of the first manifold portion 17 and the second manifold portion 18 on the liquid ejecting surface 20*a* side. In this embodiment, such a compliance substrate 45 includes a sealing film 46 made of a flexible thin film and a fixed substrate 47 made of a hard material such as a metal. Since the region of the fixed substrate 47 facing the manifold 100 is an opening portion 48 for fixed substrate completely removed in the thickness direction, one surface of the manifold 100 is a compliance portion 49 serving as a flexible portion sealed only with the flexible sealing film 46.

The case member 40 is provided with an introduction path 44 for communicating with the manifold 100 and supplying ink to each manifold 100. In addition, the case member 40 is provided with a connection port 43 that communicates with the through-hole 32 of the protective substrate 30 and through which the flexible cable 120 is inserted.

In such a recording head 1, when ink is ejected, the ink is taken from the introduction path 44, and the inside of the flow path is filled with the ink from the manifold 100 to the nozzle 21. Thereafter, according to a signal from the driving circuit 121, a voltage is applied to each of the active portions 310 corresponding to the pressure generating chambers 12, so that the vibration plate 50 and the active portion 310 are bent and deformed. As a result, the pressure in the pressure generating chamber 12 increases, and ink droplets are ejected from the predetermined nozzle 21.

As described above, in the embodiment, the device includes the flow path forming substrate 10 serving as the substrate on which the plurality of the pressure generating chambers 12 as the first recessed portions are formed, the vibration plate 50 provided on one surface side of the flow path forming substrate 10, the first electrode 60 provided on the one surface side of the flow path forming substrate 10 via the vibration plate 50, the piezoelectric layer 70 provided on the first electrode 60, and the piezoelectric element 300 that has the second electrode 80 provided on the piezoelectric layer 70, in which in the piezoelectric element 300, the active portion 310 of the piezoelectric layer 70 interposed between the first electrode 60 and the second electrode 80 is provided independently for each of the pressure generating chambers 12, the first electrode 60 forms the individual electrode provided independently for each of the active portions 310, the second electrode 80 forms the common electrode commonly provided to the plurality of the active portions 310, in the piezoelectric layer 70, the second recessed portion 71 which is provided outside the active portion 310 and opens on a side opposite to the flow path forming substrate 10 is provided, and in the third direction Z serving as the lamination direction of the flow path forming substrate 10 and the piezoelectric element 300, the vibration plate 50 has the nitride film 52 as an uppermost layer on the second electrode 80 side at least in a region overlapping the bottom surface 711 of the second recessed portion 71.

As described above, by providing the second recessed portion 71, it is possible to improve the displacement characteristics of the piezoelectric element 300. Even if the uppermost layer of the vibration plate 50 corresponding to the second recessed portion 71 approaches the external atmosphere, by providing the second recessed portion 71, by providing the nitride film 52 as the uppermost layer corresponding to the second recessed portion 71 of the vibration plate 50, it is possible to inhibit the characteristic of the vibration plate 50 from being changed by moisture, and to inhibit the breakage of the vibration plate 50.

In addition, it is preferable that the vibration plate 50 have the zirconium oxide film 53 containing the zirconium oxide at least in the region overlapping the active portion 310 serving as the region not overlapping the bottom surface 711 of the second recessed portion 71, of the regions overlapping the region where the piezoelectric layer 70 is formed in the third direction Z serving as the lamination direction, and the zirconium oxide film 53 be provided closer to the piezoelectric layer 70 side than the nitride film 52. According to this, by providing the zirconium oxide film 53 on the vibration plate 50, the rigidity and toughness of the vibration plate 50 can be ensured. In addition, by providing the zirconium oxide film 53 on the active portion 310 side from the nitride film 52 of the vibration plate 50, the crystal plane of the piezoelectric layer 70 can be preferentially oriented on the (100) plane by epitaxial growth on the first electrode 60, and the displacement characteristic of the active portion 310 can be improved. In addition, by providing the zirconium oxide film 53 in a region overlapping the active portion 310 of the vibration plate 50, it is possible to inhibit diffusion of components such as lead (Pb) and bismuth (Bi) contained in the piezoelectric layer 70 below the zirconium oxide film 53.

In addition, it is preferable that the zirconium oxide film 53 be provided only in the region overlapping the active portion 310 in the third direction Z serving as the lamination direction. According to this, the moisture permeated through the second electrode 80 is inhibited from reaching the zirconium oxide film 53 without bringing the zirconium oxide film 53 close to the outside atmosphere, and it is possible to inhibit the zirconium oxide film 53 from reacting with moisture and to inhibit changes in characteristics of the zirconium oxide film 53 due to moisture.

In addition, in the embodiment, it is preferable that the plurality of the active portions 310 be disposed in parallel in the first direction X, and the second recessed portions 71 be provided on both sides of the active portion 310 in the first direction X. According to this, the active portion 310 can be disposed in high density in the first direction X and the displacement amount of the active portion 310 in the third direction Z in the cross section in the first direction X can be improved.

In addition, it is preferable that in the third direction Z serving as the lamination direction, the second recessed portion 71 and the pressure generating chamber 12 serving as the first recessed portion be disposed on at least a position partially overlapping each other. According to this, the rigidity of the arm portion between the wall surface of the flow path forming substrate 10 and the active portion 310 can be reduced by the second recessed portion 71 to improve the displacement characteristic of the active portion 310.

It goes without saying that in the third direction Z, the pressure generating chamber 12 serving as the first recessed portion and the second recessed portion 71 may not be disposed on at least the position partially overlapping each other.

It is preferable that the second recessed portion 71 be provided so as to penetrate the piezoelectric layer 70 in the third direction Z serving as the lamination direction. According to this, when the second recessed portion 71 penetrates the piezoelectric layer 70 in the third direction Z, the rigidity of the arm portion is decreased and the displacement characteristic of the active portion 310 can be improved. In addition, by providing the second electrode 80 over the inner surface of the second recessed portion 71, adhesion between the nitride film 52 and the second electrode 80 on the bottom surface of the second recessed portion 71 can be improved and separation of the vibration plate 50 from the second electrode 80 can be inhibited.

It goes without saying that the second recessed portion 71 may be provided without penetrating the piezoelectric layer 70 in the third direction Z. In addition, the second electrode 80 may not be provided on the inner surface of the second recessed portion 71.

In addition, it is preferable that the vibration plate 50 have the oxide film 51 containing the silicon oxide on the flow path forming substrate 10 side. In addition, the oxide film 51 preferably contains the silicon oxide. By providing the oxide film 51 containing the silicon oxide in this manner, when forming the pressure generating chamber 12 as the first recessed portion by anisotropically etching the flow path forming substrate 10, it is possible to inhibit over-etching of the vibration plate 50, to inhibit variations in the thickness of the vibration plate 50, and to inhibit occurrence of variations in the displacement characteristics of the active portion 310.

Embodiment 2

Figure 6:
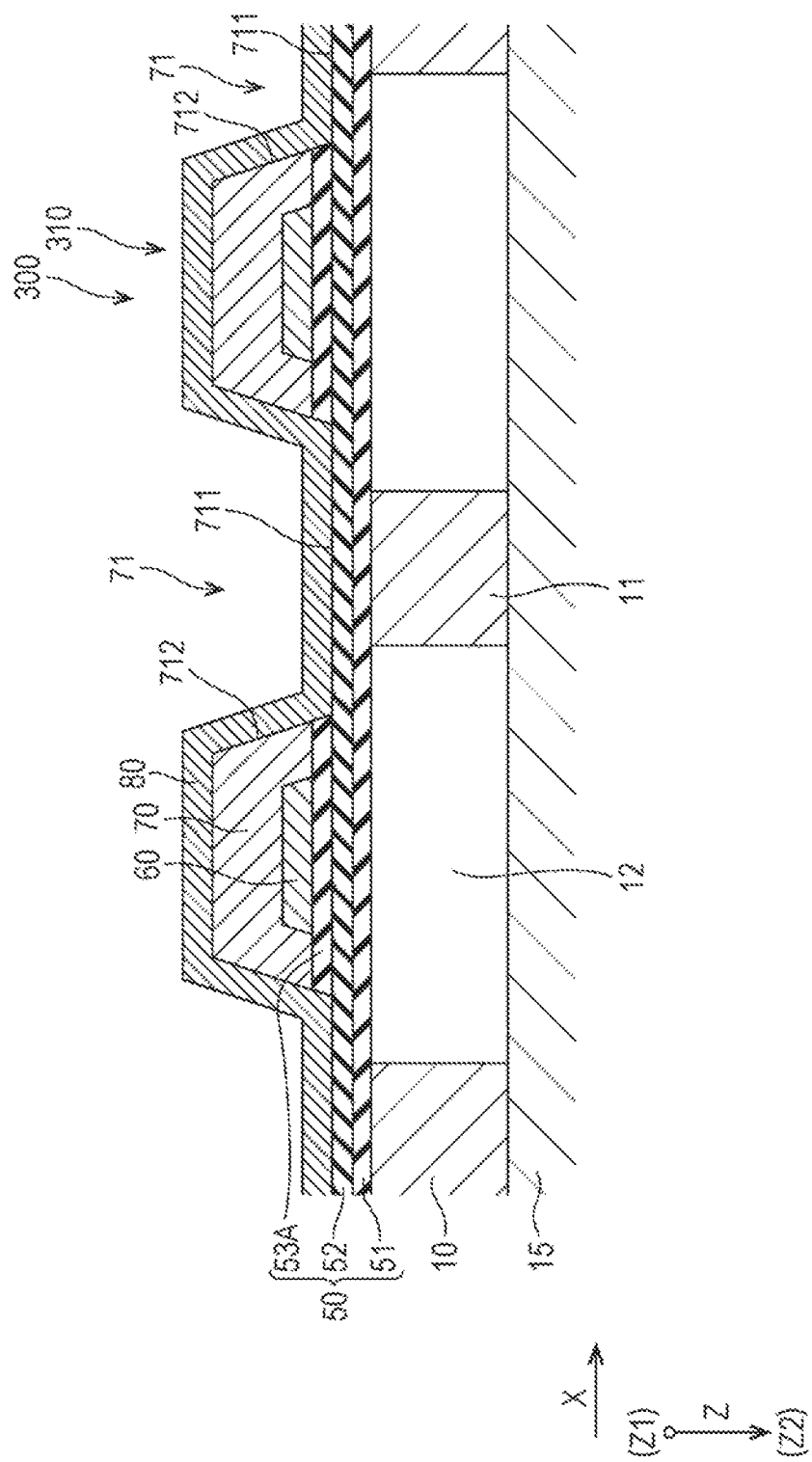
FIG. 6 is an enlarged cross-sectional view of a main part of a recording head according to Embodiment 2 of the invention.

FIG. 6 is a cross-sectional view of a main part of an ink jet type recording head as an example of a liquid ejecting head according to Embodiment 2 of the invention, which is a cross-sectional view taken along line VI-VI in FIG. 2. The same reference numerals are given to members similar to those in the above-described embodiment, and redundant explanations are omitted.

As shown in FIG. 6, the vibration plate 50 of the embodiment has the oxide film 51 containing the silicon oxide, the nitride film 52, and a zirconium oxide film 53A containing the zirconium oxide.

The zirconium oxide film 53A of the embodiment is provided closer to the piezoelectric layer 70 side than the nitride film 52. In addition, the zirconium oxide film 53A is provided over the region not overlapping the bottom surface 711 of the second recessed portion 71, of the regions overlapping the region where the piezoelectric layer 70 is formed in the third direction Z serving as the lamination direction. That is, the zirconium oxide film 53A is provided over the entire surface of the region overlapping with the active portion 310 in the third direction Z and the region overlapping between the active portion 310 and the bottom surface 711 of the second recessed portion 71.

The zirconium oxide film 53A is exposed so as to form a portion of the side surface 712 of the second recessed portion 71, and the second electrode 80 is formed on the end surface of the zirconium oxide film 53 exposed on the side surface 712 of the second recessed portion 71. That is, the zirconium oxide film 53A is provided in contact with the second electrode 80 formed on the side surface 712 of the second recessed portion 71.

As described above, in the embodiment, the vibration plate 50 has the zirconium oxide film 53A containing the zirconium oxide at least in the region overlapping the active portion 310, serving as the region not overlapping the bottom surface 711 of the second recessed portion 71, of the regions overlapping the region where the piezoelectric layer 70 is formed in the third direction Z serving as the lamination direction, and the zirconium oxide film 53A is provided closer to the piezoelectric layer 70 than the nitride film 52. In the embodiment, the zirconium oxide film 53A is provided under the piezoelectric layer 70 over the region other than the region overlapping the bottom surface 711 of the second recessed portion 71. Accordingly, the rigidity and toughness of the vibration plate 50 can be further improved as compared with a case where the zirconium oxide film is provided only in the region overlapping the active portion 310. In addition, due to the zirconium oxide film 53A, it is possible to further inhibit diffusion of components such as lead (Pb) and bismuth (Bi) contained in the piezoelectric layer 70 to the oxide film 51 and the flow path forming substrate 10.

In the embodiment, since the zirconium oxide film 53A is provided in contact with the second electrode 80, moisture permeated through the second electrode 80 reacts with the zirconium oxide film 53A, and there is a possibility that the characteristics may be changed by hydrolysis of the zirconium oxide film 53A. However, the zirconium oxide film 53A is merely provided in a portion other than the second recessed portion 71 in the arm portion between the wall surface of the pressure generating chamber 12 and the active portion 310. By forming the second recessed portion 71 of the arm portion by driving the active portion 310, a portion overlapping the second recessed portion 71 in which the rigidity is decreased is mainly deformed. Therefore, for example, even if the zirconium oxide film 53A is hydrolyzed by moisture, if delamination due to moisture does not occur in the region overlapping the second recessed portion 71 of the vibration plate 50, since the portion overlapping the second recessed portion 71 of the arm portion, which is mainly deformed, is supported by the oxide film 51, the nitride film 52, and the second electrode 80, occurrence of breakage in the vibration plate 50 can be inhibited.

Embodiment 3

Figure 7:
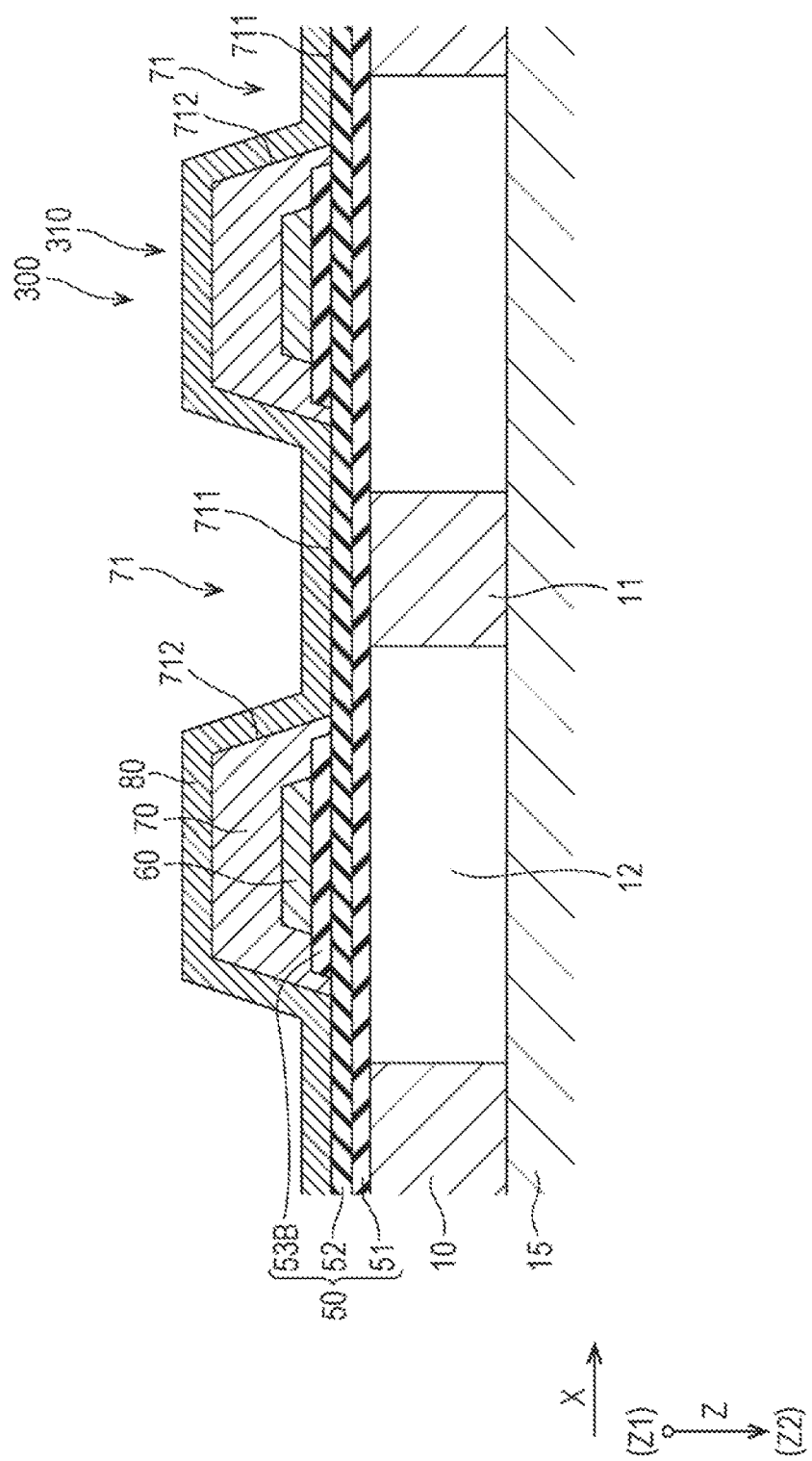
FIG. 7 is an enlarged cross-sectional view of a main part of a recording head according to Embodiment 3 of the invention.

FIG. 7 is a cross-sectional view of a main part of an ink jet type recording head as an example of a liquid ejecting head according to Embodiment 3 of the invention, which is a cross-sectional view taken along line VII-VII in FIG. 2. The same reference numerals are given to members similar to those in the above-described embodiment, and redundant explanations are omitted.

As shown in FIG. 7, the vibration plate 50 of the embodiment has the oxide film 51 containing the silicon oxide, the nitride film 52, and a zirconium oxide film 53B containing the zirconium oxide.

The zirconium oxide film 53B of the embodiment is provided closer to the piezoelectric layer 70 side than the nitride film 52. In addition, the zirconium oxide film 53B is provided in the region overlapping the active portion 310, serving as the region not overlapping the bottom surface 711 of the second recessed portion 71, of the regions overlapping the region where the piezoelectric layer 70 is formed in the third direction Z serving as the lamination direction.

In addition, the zirconium oxide film 53B is extended without coming into contact with the second electrode 80 formed on the side surface 712 of the second recessed portion 71 in the region overlapping between the active portion 310 and the bottom surface 711 of the second recessed portion 71. That is, the piezoelectric layer 70 is interposed between the second electrode 80 on the side surface 712 of the second recessed portion 71 and the zirconium oxide film 53B.

As described above, in the embodiment, the vibration plate 50 has the zirconium oxide film 53B containing the zirconium oxide at least in the region overlapping the active portion 310, serving as the region not overlapping the bottom surface 711 of the second recessed portion 71, of the regions overlapping the region where the piezoelectric layer 70 is formed in the third direction Z serving as the lamination direction, and the zirconium oxide film 53B is provided closer to the piezoelectric layer 70 than the nitride film 52. In the embodiment, the second electrode 80 is formed on the inner surface of the second recessed portion 71. In addition, in the embodiment, the zirconium oxide film 53B is extended without coming into contact with the second electrode 80 formed on the side surface 712 of the second recessed portion 71 in the region overlapping between the active portion 310 and the bottom surface 711 of the second recessed portion 71.

As described above, by providing the zirconium oxide film 53B on the vibration plate 50, the rigidity and toughness of the vibration plate 50 can be further improved as compared with the case where the zirconium oxide film is provided only in the region overlapping the active portion 310. In addition, due to the zirconium oxide film 53B, not only in the region overlapping the active portion 310 but also in the region overlapping between the active portion 310 and the bottom surface 711 of the second recessed portion 71, it is possible to further inhibit diffusion of components such as lead (Pb) and bismuth (Bi) contained in the piezoelectric layer 70 to the oxide film 51 and the flow path forming substrate 10.

In addition, in the embodiment, since the second electrode 80 is provided on the inner surface of the second recessed portion 71, even if the vibration plate 50 approaches the external atmosphere by the second recessed portion 71, it is possible to inhibit the moisture from permeating to the vibration plate 50 by the second electrode 80.

In addition, in the embodiment, the zirconium oxide film 53B is extended without coming into contact with the second electrode 80 formed on the side surface 712 of the second recessed portion 71 in the region overlapping between the active portion 310 and the bottom surface 711 of the second recessed portion 71. Therefore, even if moisture permeates through the second electrode 80 formed on the side surface 712 of the second recessed portion 71, the permeated moisture is unlikely to reach the zirconium oxide film 53B, and it is possible to inhibit the zirconium oxide film 53B from reacting with moisture and to inhibit the hydrolysis of the zirconium oxide film 53B due to moisture. Therefore, it is possible to inhibit breakage due to the fact that the arm portion supporting the active portion 310 is configured to include only the vibration plate 50 due to the separation of the vibration plate 50 from the second electrode 80, the separation of the vibration plate 50 from the piezoelectric layer 70, and the separation of the vibration plate 50 from the first electrode 60.

Embodiment 4

Figure 8:
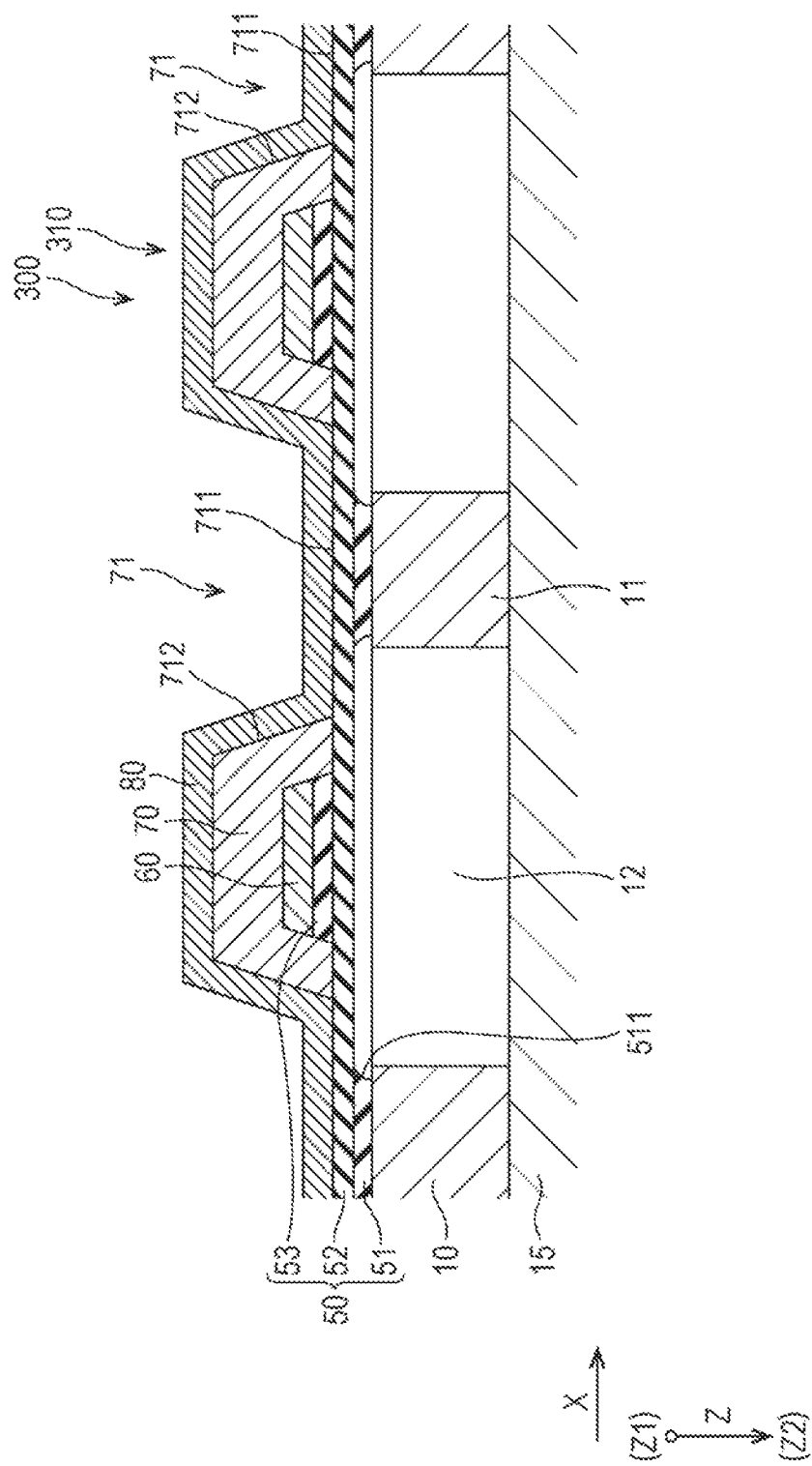
FIG. 8 is an enlarged cross-sectional view of a main part of a recording head according to Embodiment 4 of the invention.

FIG. 8 is a cross-sectional view of a main part of an ink jet type recording head as an example of a liquid ejecting head according to Embodiment 4 of the invention, which is a cross-sectional view taken along line VIII-VIII in FIG. 2. The same reference numerals are given to members similar to those in the above-described embodiment, and redundant explanations are omitted.

As shown in FIG. 8, the vibration plate 50 of the embodiment has the oxide film 51, the nitride film 52, and the zirconium oxide film 53 containing the zirconium oxide.

The oxide film 51 is provided only between the partition wall 11 and the nitride film 52, and is not provided in a region facing the pressure generating chamber 12. That is, on the oxide film 51, an opening portion 511 including an opening on the Z1 side of the pressure generating chamber 12 in the third direction Z and having an opening area larger than that of the opening is provided. Therefore, only the nitride film 52 and the zirconium oxide film 53 are provided in the region facing the pressure generating chamber 12 of the vibration plate 50, and the nitride film 52 and the zirconium oxide film 53 substantially function as the vibration plate 50.

After forming the oxide film 51 over the entire surface of one side surface of the flow path forming substrate 10 on the Z1 side, the pressure generating chamber 12 is formed by anisotropically etching the flow path forming substrate 10. Thereafter, the opening portion 511 can be formed by etching the oxide film 51 exposed in the pressure generating chamber 12 with hydrofluoric acid or the like. Examples of the method of forming the oxide film 51 include a method of thermally oxidizing one surface side of the flow path forming substrate 10 made of the silicon oxide, a film formation by a CVD method, a sputtering method, or the like.

As described above, by forming the oxide film 51 containing the silicon oxide on the entire surface of the flow path forming substrate 10 on the Z1 side, when forming the pressure generating chamber 12 by anisotropic etching of the flow path forming substrate 10, the oxide film 51 can be used as an etching stop layer, and variations in thickness due to over-etching of the vibration plate 50 can be inhibited. In addition, after forming the pressure generating chamber 12, the oxide film 51 is etched with hydrofluoric acid or the like to form the opening portion 511, so that the region of the vibration plate 50 facing the pressure generating chamber 12 can be configured to include only the nitride film 52 and the zirconium oxide film 53. Therefore, it is possible to inhibit the rigidity of the flexible portion opposing the pressure generating chamber 12 of the vibration plate 50 from being remarkably increased by the oxide film 51, and thus the displacement characteristic of the active portion 310 can be improved.

In the embodiment, the opening portion 511 is formed by etching the oxide film 51 containing the silicon oxide with hydrofluoric acid or the like, and the invention is not particularly limited thereto. The pressure generating chamber 12 and the opening portion 511 may be formed by dry etching the flow path forming substrate 10 and the oxide film 51.

As described above, in the embodiment, the vibration plate 50 has the oxide film 51 on the flow path forming substrate 10 side serving as the substrate. The oxide film 51 of the embodiment has the opening portion 511 communicating with the pressure generating chamber 12 serving as the first recessed portion. By providing the oxide film 51 in this manner, when forming the pressure generating chamber 12 as the first recessed portion by anisotropically etching the flow path forming substrate 10, it is possible to inhibit over-etching of the vibration plate 50, to inhibit variations in the thickness of the vibration plate 50, and to inhibit occurrence of variations in the displacement characteristics of the active portion 310.

In addition, by providing the opening portion 511 communicating with the pressure generating chamber 12 on the oxide film 51, the active portion 310 can be inhibited from being constrained by the oxide film 51 and the displacement characteristic of the active portion 310 can be improved.

In the embodiment, the same zirconium oxide film 53 as that in Embodiment 1 is provided, and the invention is not particularly limited thereto. The zirconium oxide film 53A of Embodiment 2 or the zirconium oxide film 53B of Embodiment 3 may be provided.

Embodiment 5

Figure 9:
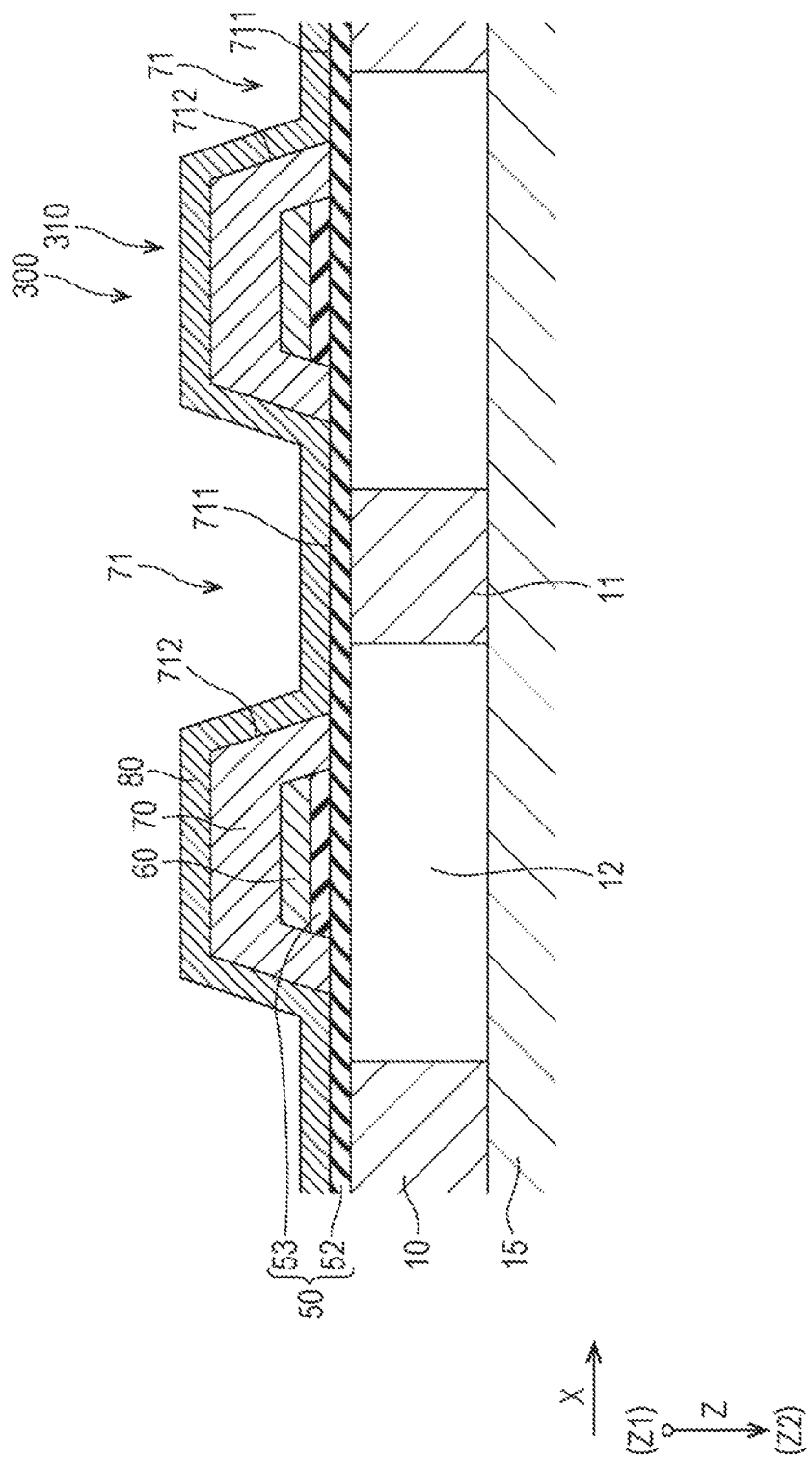
FIG. 9 is an enlarged cross-sectional view of a main part of a recording head according to Embodiment 5 of the invention.

FIG. 9 is a cross-sectional view of a main part of an ink jet type recording head as an example of a liquid ejecting head according to Embodiment 5 of the invention, which is a cross-sectional view taken along line IX-IX in FIG. 2. The same reference numerals are given to members similar to those in the above-described embodiment, and redundant explanations are omitted.

As shown in FIG. 9, the vibration plate 50 of the embodiment has the nitride film 52 and the zirconium oxide film 53. That is, the vibration plate 50 of the embodiment is not provided with the oxide film 51.

Since there is a possibility that the vibration plate 50 provided with the nitride film 52 on the lowermost layer on the flow path forming substrate 10 side in this manner is simultaneously etched when the flow path forming substrate 10 is anisotropically etched, the pressure generating chamber 12 may be formed on the flow path forming substrate 10 by dry etching.

Even with such a configuration, by providing the nitride film 52 similarly to Embodiment 1 described above, it is possible to inhibit the change in the characteristic due to the moisture of the vibration plate 50, to inhibit the separation of the vibration plate 50 from the second electrode 80, and to inhibit the breakage of the vibration plate 50.

In the embodiment, the same zirconium oxide film 53 as that in Embodiment 1 is provided, and the invention is not particularly limited thereto. The zirconium oxide film 53A of Embodiment 2 or the zirconium oxide film 53B of Embodiment 3 may be provided.

Embodiment 6

Figure 10:
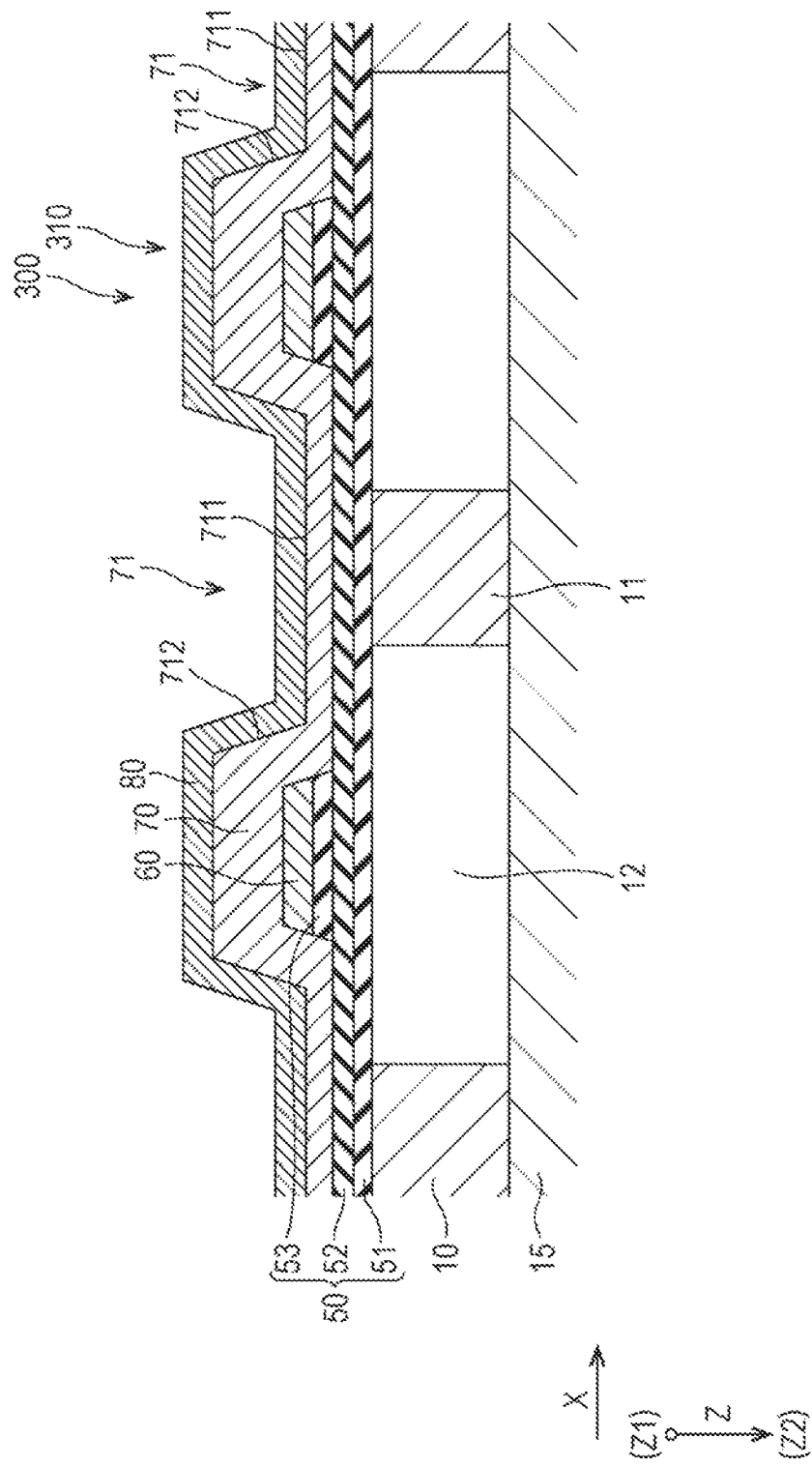
FIG. 10 is an enlarged cross-sectional view of a main part of a recording head according to Embodiment 6 of the invention.

FIG. 10 is a cross-sectional view of a main part of an ink jet type recording head as an example of a liquid ejecting head according to Embodiment 6 of the invention, which is a cross-sectional view taken along line X-X in FIG. 2. The same reference numerals are given to members similar to those in the above-described embodiment, and redundant explanations are omitted.

As shown in FIG. 10, in the embodiment, the second recessed portion 71 is formed in a state where the piezoelectric layer 70 is left on the bottom surface 711 side, without penetrating the piezoelectric layer 70 in the third direction Z serving as the lamination direction. The vibration plate 50 has the oxide film 51, the nitride film 52, and the zirconium oxide film 53 similarly to Embodiment 1 described above.

Even with such a configuration, similarly to Embodiment 1 described above, the displacement characteristic of the piezoelectric element 300 can be improved by providing the second recessed portion 71. Even if the bottom surface 711 of the second recessed portion 71 of the vibration plate 50 approaches the external atmosphere by providing the second recessed portion 71, since the nitride film 52 is formed as the uppermost layer of the region overlapping the bottom surface 711 of the vibration plate 50, it is possible to inhibit the reaction of the vibration plate 50 with moisture. Therefore, it is possible to inhibit the breakage of the vibration plate 50. That is, although the piezoelectric layer 70 is provided on the bottom surface 711 of the second recessed portion 71, the thickness of the piezoelectric layer 70 in the third direction Z may be thinner than that of the active portion 310, and the moisture penetrated through the second electrode 80 may penetrate through the piezoelectric layer 70 having a small thickness and reach the vibration plate 50. Even if the moisture contained in the external atmosphere permeates the second electrode 80 and the piezoelectric layer 70 at the bottom surface 711 of the second recessed portion 71 in this manner, since the portion of the vibration plate 50 overlapping the bottom surface 711 is formed of the nitride film 52, it is possible to inhibit the reaction of the vibration plate 50 due to moisture.

In the embodiment, a configuration in which the vibration plate 50 of Embodiment 1 described above is provided is exemplified, and the invention is not particularly limited thereto. The vibration plate 50 of Embodiments 2 to 5 described above may be provided.

Embodiment 7

Figure 11:
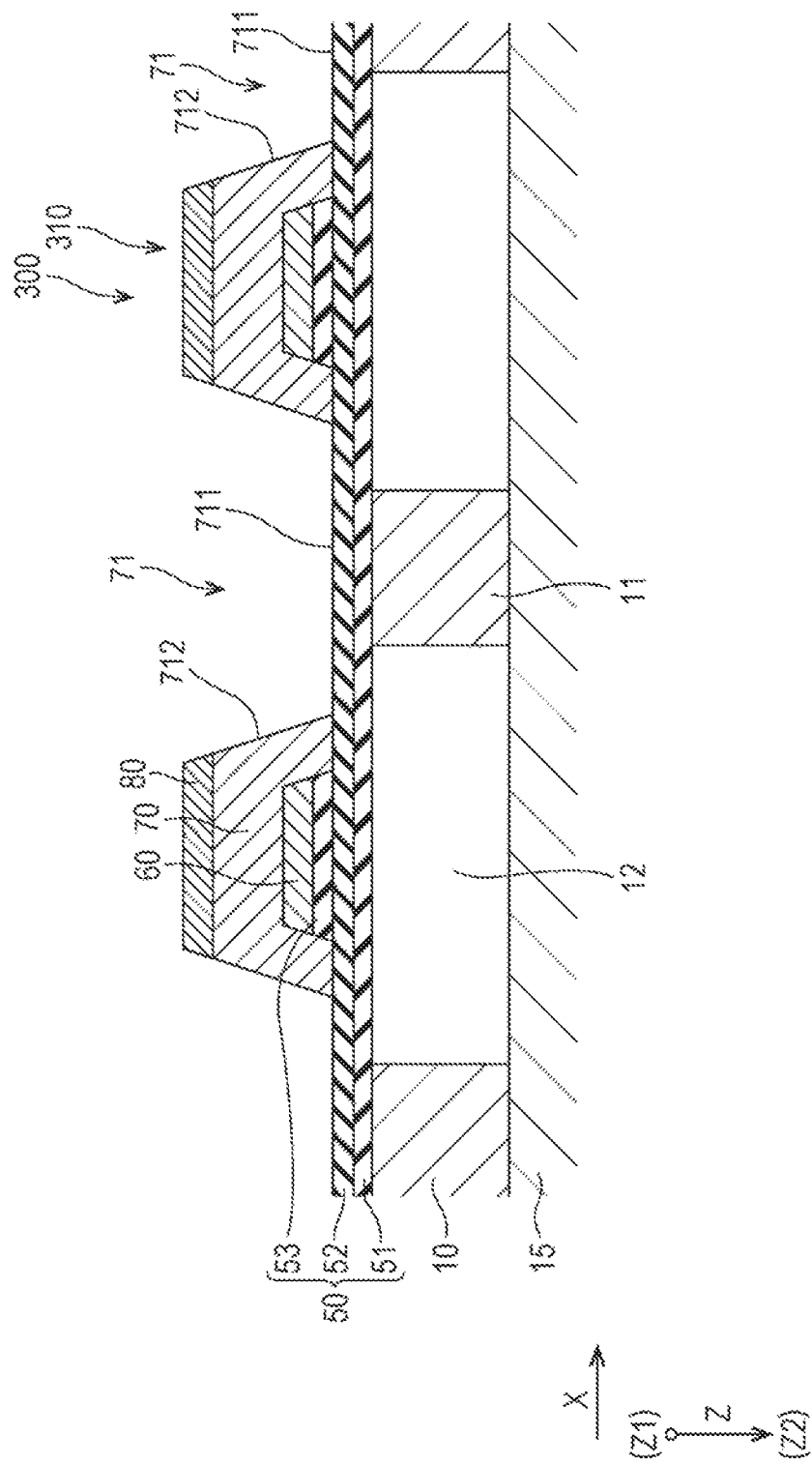
FIG. 11 is an enlarged cross-sectional view of a main part of a recording head according to Embodiment 7 of the invention.

FIG. 11 is a cross-sectional view of a main part of an ink jet type recording head as an example of a liquid ejecting head according to Embodiment 7 of the invention, which is a cross-sectional view taken along line XI-XI in FIG. 2. The same reference numerals are given to members similar to those in the above-described embodiment, and redundant explanations are omitted.

As shown in FIG. 11, the second electrode 80 of the embodiment is not formed on the inner surface of the second recessed portion 71, that is, on the bottom surface 711 and the side surface 712. The vibration plate 50 is provided with the oxide film 51, the nitride film 52, and the zirconium oxide film 53 similarly to Embodiment 1 described above. That is, the nitride film 52 is exposed to the outside without being covered with the second electrode 80 on the bottom surface 711 of the second recessed portion 71.

Even with such a configuration, similarly to Embodiment 1 described above, the displacement characteristic of the piezoelectric element 300 can be improved by providing the second recessed portion 71. Even if the bottom surface 711 of the second recessed portion 71 of the vibration plate 50 approaches the external atmosphere by providing the second recessed portion 71, since the nitride film 52 is formed as the uppermost layer of the region overlapping the bottom surface 711 of the vibration plate 50, the reaction of the vibration plate 50 with moisture can be inhibited. Therefore, it is possible to inhibit the vibration plate 50 from being broken.

In the embodiment, a configuration in which the vibration plate 50 of Embodiment 1 described above is provided is exemplified, and the invention is not particularly limited thereto. The piezoelectric layer 70 of the embodiment may be provided with the vibration plate 50 Embodiments 2 to 5 described above.

Other Embodiment

Hereinbefore, although the embodiments of the invention are described, the basic configuration of the invention is not limited to the above-described embodiments.

For example, in each of the above-described embodiments, the zirconium oxide films 53 to 53B are provided on the vibration plate 50, and it is also possible to dispose the zirconium oxide film 53B on the vibration plate 50.

In addition, in each of the above-described embodiments, the nitride film 52 is continuously provided over the entire surface on the Z1 side of the flow path forming substrate 10, and the invention is not limited thereto. If the nitride film 52 is provided as the uppermost layer on the second electrode 80 side at least in the region overlapping the bottom surface 711 of the second recessed portion 71, it is possible to use a material that is less susceptible to moisture on the lower layer on the flow path forming substrate 10 side from the nitride film 52 because the portion closest to the external atmosphere of the vibration plate 50 can be protected from moisture.

In addition, for example, in each of the embodiments described above, an example in which the communicating plate 15 and the nozzle plate 20 are provided on the Z2 side of the flow path forming substrate 10 is exemplified, and the invention is not particularly limited thereto. For example, the nozzle plate 20 may be bonded directly to the surface on the Z2 side of the flow path forming substrate 10 without providing the communicating plate 15.

In addition, in Embodiment 1 described above, a single crystal silicon substrate is used as the flow path forming substrate 10, and the invention is not limited thereto. As the flow path forming substrate 10, materials such as an SOI substrate and glass may be used.

Figure 12:
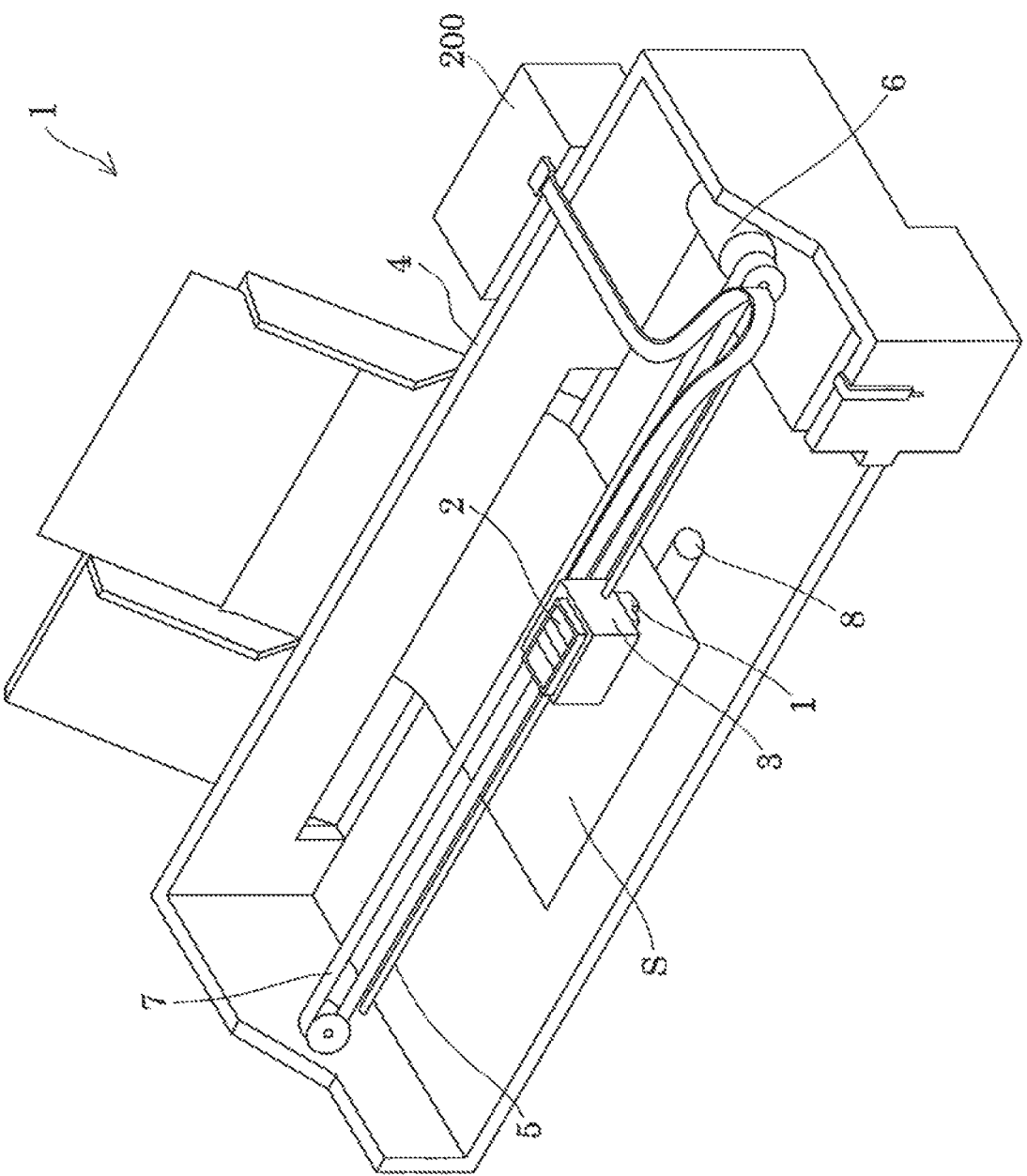
FIG. 12 is a schematic diagram of a recording apparatus according to an embodiment of the invention.

Such a recording head 1 is mounted on an ink jet type recording apparatus I. FIG. 12 is a schematic diagram showing an example of the ink jet type recording apparatus of the embodiment.

In the ink jet type recording apparatus I shown in FIG. 12, the recording head 1 is detachably provided with a cartridge 2 forming liquid supply means, and a carriage 3 on which the recording head 1 is mounted is provided so as to be movable in the axial direction on a carriage shaft 5 attached to an apparatus body 4.

A driving force of a driving motor 6 is transmitted to the carriage 3 via a plurality of gears (not shown) and a timing belt 7, so that the carriage 3 on which the recording head 1 is mounted is moved along the carriage shaft 5. On the other hand, the apparatus body 4 is provided with a transport roller 8 as transport means, and a recording sheet S which is a recording medium such as paper is transported by the transport roller 8. The transport means transporting the recording sheet S is not limited to the transport roller, and may be a belt, a drum, or the like.

In addition, in the above-described example, the inkjet recording apparatus I has a configuration in which the cartridge 2 as ink supply means is mounted on the carriage 3, and the invention is not particularly limited thereto. For example, a liquid supply means such as an ink tank may be fixed to the apparatus body 4, and the liquid supply means and the recording head 1 may be connected via a supply pipe such as a tube. In addition, the liquid supply means may not be mounted on the ink jet type recording apparatus.

Furthermore, in the ink jet type recording apparatus I described above, an example in which the recording head 1 is mounted on the carriage 3 and moves in a main scanning direction is exemplified, and the invention is not particularly limited thereto. For example, the invention can also be applied to a so-called line type recording apparatus in which the recording head 1 is fixed and printing is performed by simply moving the recording sheet S such as paper in a sub-scanning direction.

In addition, the invention broadly covers the liquid ejecting head in general, and can also be applied to a recording head such as various ink jet recording heads used in an image recording apparatus such as a printer, a color material ejecting head used in manufacturing a color filter such as a liquid crystal display, an electrode material ejecting head used in forming an electrode of an organic EL display, an field emission display (FED), a bioorganic material ejecting head used in manufacturing a bio chip, and the like. In addition, the ink jet type recording apparatus I is described as an example of a liquid ejecting apparatus, it can also be used for a liquid ejecting apparatus using other liquid ejecting heads described above.

In addition, the invention is not limited to the liquid ejecting head, and can also be applied to other piezoelectric devices having a substrate provided with a recessed portion and a piezoelectric actuator. Examples of other piezoelectric devices include an ultrasonic device such as an ultrasonic transmitter, an ultrasonic motor, a temperature-electric converter, a pressure-electric converter, a ferroelectric transistor, a piezoelectric transformer, a filter such as a filter for blocking harmful rays such as infrared rays, an optical filter using a photonic crystal effect by forming quantum dots, and an optical filter using optical interference of a thin film, various sensors such as an infrared sensor, an ultrasonic sensor, a thermal sensor, a pressure sensor, a pyroelectric sensor, and a gyro sensor (angular velocity sensor), a ferroelectric memory, and the like.

What is claimed is:

1. A piezoelectric device comprising:
a substrate on which a plurality of first recessed portions are formed;
a vibration plate provided on one surface side of the substrate; and
a piezoelectric element that has a first electrode provided on the one surface side of the substrate via the vibration plate, a piezoelectric layer provided on the first electrode, and a second electrode provided on the piezoelectric layer,
wherein in the piezoelectric element, an active portion of the piezoelectric layer interposed between the first electrode and the second electrode is provided independently for each of the first recessed portions,
the first electrode forms an individual electrode provided independently for each of the active portions,
the second electrode forms a common electrode commonly provided to a plurality of the active portions,
in the piezoelectric layer, a second recessed portion which is provided outside the active portion and opens on a side opposite to the substrate is provided, and
the vibration plate includes a nitride film and a zirconium oxide film, the nitride film and the zirconium oxide film being laminated in a lamination direction of the substrate and the piezoelectric element, and the zirconium oxide film being closer to the piezoelectric element than the nitride film,
each of the nitride film and the zirconium oxide film are provided in a first area of the vibration plate, the first area being overlapped with the piezoelectric layer in a first direction that is orthogonal to the lamination direction, and
the nitride film is provided and the zirconium oxide film is not provided in a second area of the vibration plate, the second area not being overlapped with the piezoelectric layer in the first direction.

2. The piezoelectric device according to claim 1, wherein the second electrode is formed on an inner surface of the second recessed portion.

3. The piezoelectric device according to claim 2, wherein the zirconium oxide film extends in a region overlapping between the active portion and the bottom surface of the second recessed portion, without being in contact with the second electrode formed on a side surface of the second recessed portion.

4. A liquid ejecting head comprising:
the piezoelectric device according to claim 3.

5. A liquid ejecting head comprising:
the piezoelectric device according to claim 2.

6. The piezoelectric device according to claim 1, wherein the zirconium oxide film is provided only in the region overlapping the active portion in the lamination direction.

7. A liquid ejecting head comprising:
the piezoelectric device according to claim 6.

8. The piezoelectric device according to claim 1, wherein the plurality of the active portions are disposed in parallel in a first direction, and the second recessed portions are provided on both sides of the active portion in the first direction.

9. A liquid ejecting head comprising:
the piezoelectric device according to claim 8.

10. The piezoelectric device according to claim 1, wherein in the lamination direction, the second recessed portion and the first recessed portion are disposed on at least a position partially overlapping each other.

11. A liquid ejecting head comprising:
the piezoelectric device according to claim 10.

12. The piezoelectric device according to claim 1, wherein the second recessed portion is provided to penetrate the piezoelectric layer in the lamination direction.

13. The piezoelectric device according to claim 1, wherein the vibration plate includes a silicon oxide film, the nitride film, the zirconium oxide film, and the silicon oxide film are laminated in the lamination direction, and
the silicon oxide film is closer to the substrate than the nitride film.

14. The piezoelectric device according to claim 13, wherein the oxide film has an opening portion communicating with the first recessed portion.

15. The piezoelectric device according to claim 13, wherein each of the nitride film, the zirconium oxide film, and the silicon oxide film are provided in the first area of the vibration plate, and
each of the nitride film and the silicon oxide film are provided and the zirconium oxide film is not provided in the second area of the vibration plate.

16. A liquid ejecting head comprising:
the piezoelectric device according to claim 1.

17. The piezoelectric device according to claim 1, wherein the first area overlaps each of the piezoelectric layer and the first electrode in the first direction, and the nitride film is provided and the zirconium oxide film is not provided in a third area of the vibration plate, the third area being overlapped with the piezoelectric layer and not being overlapped with the first electrode.

* * * * *